United States Patent
Regev

(10) Patent No.: US 7,733,131 B2
(45) Date of Patent: Jun. 8, 2010

(54) SIGNAL PRESENCE DETECTOR

(75) Inventor: Zvi Regev, West Hills, CA (US)

(73) Assignee: MRV Communications, Inc., Chatsworth, CA (US)

( * ) Notice: Subject to any disclaimer, the term of this patent is extended or adjusted under 35 U.S.C. 154(b) by 0 days.

(21) Appl. No.: 11/493,149

(22) Filed: Jul. 25, 2006

(65) Prior Publication Data

US 2007/0085571 A1 Apr. 19, 2007

Related U.S. Application Data

(60) Provisional application No. 60/701,865, filed on Jul. 25, 2005.

(51) Int. Cl.
*H03K 5/19* (2006.01)

(52) U.S. Cl. .......................................... 327/18; 327/20

(58) Field of Classification Search .............. 327/18–27
See application file for complete search history.

(56) References Cited

U.S. PATENT DOCUMENTS

| | | | |
|---|---|---|---|
| 3,956,772 A * | 5/1976 | Cox | 600/19 |
| 5,966,406 A | 10/1999 | Hsich et al. | |
| 6,198,317 B1 * | 3/2001 | Chow et al. | 327/116 |
| 6,710,605 B2 * | 3/2004 | Tang et al. | 324/614 |
| 6,907,202 B1 | 6/2005 | Ide et al. | |
| 7,031,616 B2 * | 4/2006 | Eilenberger et al. | 398/155 |
| 2003/0016412 A1 | 1/2003 | Eilenberger et al. | |

* cited by examiner

*Primary Examiner*—Dinh T. Le
(74) *Attorney, Agent, or Firm*—Bergman & Song LLP; Michael Bergman

(57) ABSTRACT

A signal presence detection device has a first reference voltage generation device in the form of a first voltage divider, a second reference voltage generation device in the form of a second voltage divider and a third reference voltage generation device in the form of a third voltage divider. The detection device also has a signal conditioning device such as a hysteretic amplifier with an output that is coupled to the first and second voltage dividers. A comparison device is coupled to all three voltage dividers to compare a voltage of the first voltage divider to a voltage of the third voltage divider and to compare a voltage of the second voltage divider to the voltage of the third voltage divider. The comparison device is coupled at two outputs thereof to two respective inputs of an XOR device. The XOR device receives respective signals from the first and second outputs of the comparison device and produces a signal presence output that serves to indicate whether an incoming signal is present or absent.

20 Claims, 24 Drawing Sheets

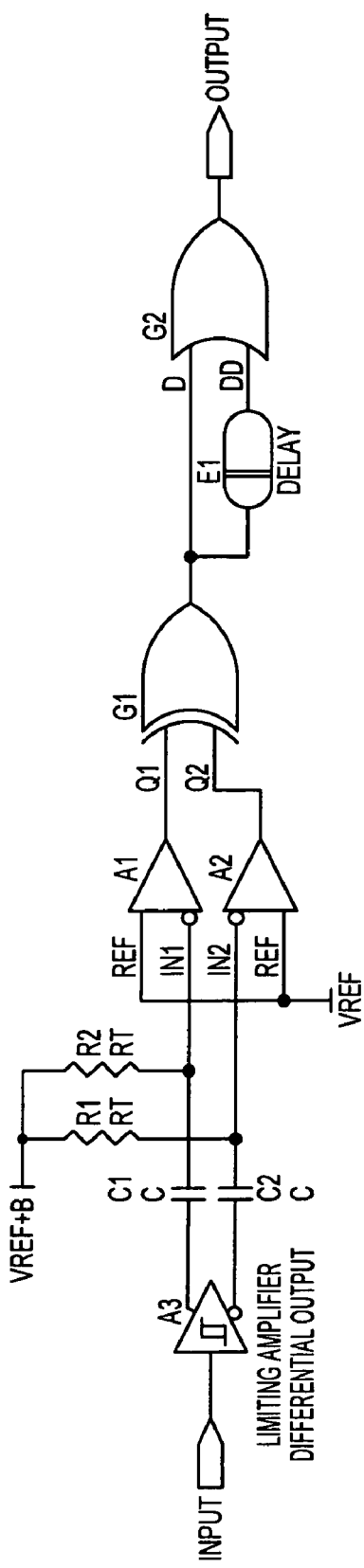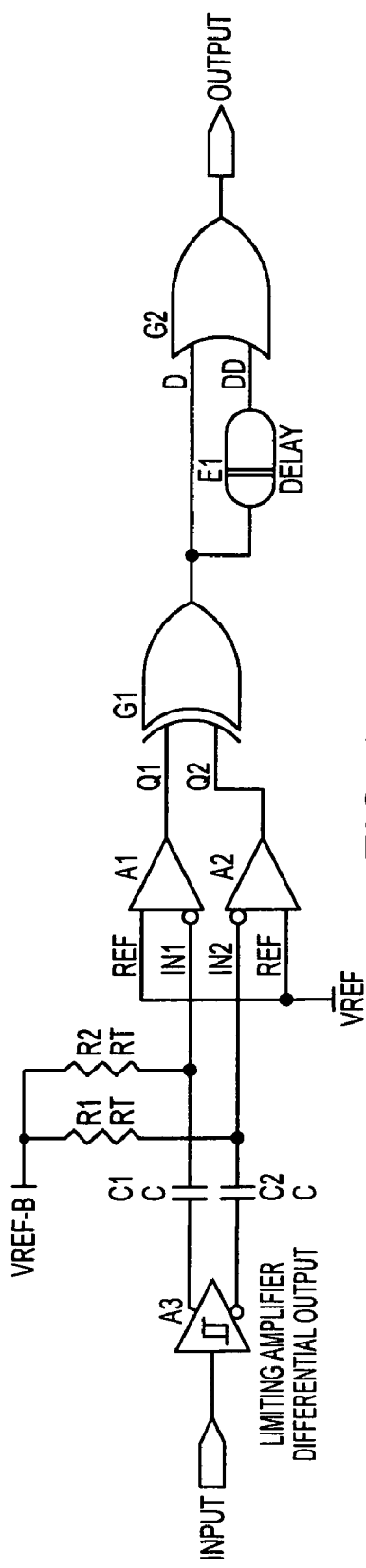
FIG. 26
FIG. 27

SIGNAL PRESENCE DETECTOR

CROSS REFERENCE TO RELATED APPLICATION

This application claims the benefit under 35 U.S.C. §119(e) of U.S. Provisional Application No. 60/701,865 filed Jul. 25, 2005, entitled Instantaneous Detection of the Presence of a Signal, the contents of which is hereby incorporated by reference in its entirety.

FIELD OF THE INVENTION

The present invention relates to data communication systems and methods and, more particularly, to intermittent data communication systems and methods.

BACKGROUND OF THE INVENTION

Data communication systems and methods are used in the transmission of information for an increasing variety of purposes, including the control of equipment. As such, improving the performance of data communication systems has become an important focus of attention. For example, optical communication systems are continually undergoing improvement in many areas related to transmission performance such as capacity, bandwidth, and instantaneous data transmission rate.

Certain communication networks require that signals be transmitted continuously, in order to ensure that clock and data recovery devices (e.g., including phase locked loop (PLL) devices) at the receiver are always synchronized and locked to receive the transmitted data. In such networks, if no payload data is awaiting transmission, a special "idle" signal is transmitted. The idle signal maintains the clock and data recovery devices in a synchronized and locked state.

Other data communication systems and methods involve the use of signals that include "burst mode" data. In burst mode data communication, one or more data packets are transmitted substantially continuously over a signal channel during a data transmission time interval. During another quiescent time interval, the signal channel is substantially free of signals. Accordingly, in some data transmission schemes a plurality of quiescent time intervals are disposed chronologically between a corresponding plurality of data transmission time intervals. The combination of the data transmission time intervals and the quiescent time intervals is known as a "datastream." The quiescent time intervals are referred to as "gaps" in the datastream.

Burst mode data transmission is employed in various applications including automatic control applications. For example, burst mode data transmission is included in various "fly-by-wire" vehicle control systems for vehicles such as wheeled vehicles and aircraft.

An exemplary fly-by-wire control system is used to actuate the aerodynamic control surfaces of an airplane. In such a system, a transducer in an airplane cockpit detects a motion of, for example, a steering yoke. The transducer produces a control signal such as an optical control signal. The signal is conveyed to an actuator over a communication medium. In the case of an optical control signal, a communication medium such as an optical fiber is used to couple the control signal from the transducer to the actuator. The control signal is received at the actuator and the actuator responsively applies a force through a mechanical linkage to an aerodynamic surface of the airplane. For example, the actuator causes a force that pivots an elevator surface in the tail of the airplane.

In some control systems, including some fly-by-wire systems, local servo devices maintain a substantially constant orientation of the control surface until a change is ordered by an action of the transducer. In such a system, active control signals are transmitted between the transducer and the actuator primarily when a change in control surface position is required. The result is a control signal that includes intervals of active data transmission and quiescent intervals. As noted above, such data transmission is referred to as burst mode data transmission.

Burst mode data transmission is also employed in other communication systems, such as computer network and telephony systems. In such systems, it is advantageous to maintain a quiescent communication channel when no payload data is available for transmission. For example, in an optical communication network, a light source, such as a laser, may be used for signaling between two devices. When no data is available for transmission, it may be preferable to extinguish the light source. By turning off the light source during quiescent periods, an operational lifetime of the light source may be extended, power may be conserved, and a risk of personal injury to, for example, maintenance personnel, may be reduced.

FIG. 1. shows a time domain graph of an exemplary burst mode digital data signal 100. The digital data signal 100 includes bursts 102, 104 of one or more packets of data separated by gaps 101, 103, 105 during which no data is transmitted. In some systems where data is not transmitted continuously, clock and data recovery devices are required to re-synchronize and re-lock for each individual burst or packet of data. To enable such re-synchronization and re-locking, a "preamble" is attached to each burst or packet. The preamble follows a pattern predefined by a communication protocol. An exemplary protocol preamble includes a succession of alternating high and low values (i.e., "1" and "0") prepended to the data as illustrated in FIG. 2.

FIG. 2 shows a time domain graph of an exemplary datastream 200. The datastream 200 includes a data burst 202 between gaps 201, 203 of the datastream. In some circumstances, it is desirable to detect the arrival of a data burst after a data gap. For example, receiving equipment or automatic gain control devices may be activated and deactivated depending on whether data is present. Accordingly, it is useful to have a signal presence detector that detects the arrival of a burst of data after a data gap.

It is known to use an integrating device to detect the arrival of a data signal. For example, a diode may be placed in series with the arriving signal. A current flowing through the diode is allowed to accumulate on a capacitor. When an electrical potential across the capacitor reaches a threshold voltage, a signal is deemed to be present. A disadvantage of this arrangement is that it does not respond rapidly to an arriving signal. The time constant of such a system can be shortened by various methods such as using a differential input signal and a corresponding pair of diodes. Because time is required for the capacitor(s) to accumulate electrical charge prior to indicating single arrival, it is difficult to respond to a first transition of an incoming signal.

SUMMARY

In view of the foregoing the inventor has concluded that there is a need for an improved device capable of promptly detecting an arrival of a signal such as a data burst signal of a burst mode data transmission. The inventor has recognized that it is advantageous to have a device capable of detecting and arriving signal substantially immediately upon reception of a first signal transition of an arriving data signal or data burst. In addition, the inventor has discovered that such a device would be particularly useful in a wide variety of applications including the detection of the presence of a signal in a very high frequency on-off key modulation signal (OOK) system, and that such a device might be used with an input signal frequency in excess of, for example, 15 GHz.

Having made the foregoing discoveries and conclusions, the inventor has further invented a signal presence detector device including these and other advantageous features. Various embodiments of the invention are described herewithin including a signal presence detection device has a first reference voltage generation device in the form of a first voltage divider, a second reference voltage generation device in the form of a second voltage divider and a third reference voltage generation device in the form of a third voltage divider.

The detection device also has a signal conditioning device such as a hysteretic amplifier with an output that is coupled to the first and second voltage dividers. A comparison device is coupled to all three voltage dividers to compare a voltage of the first voltage divider to a voltage of the third voltage divider and to compare a voltage of the second voltage divider to the voltage of the third voltage divider. The comparison device is coupled at two outputs thereof to two respective inputs of an XOR device. The XOR device receives respective signals from the first and second outputs of the comparison device and produces a signal presence output that serves to indicate whether an incoming signal is present or absent.

In operation, a signal is received at an input of the signal presence detection device. This signal is applied to an input of a hysteretic amplifier. When the signal is quiescent, and output of the amplifier remains in a quiescent state (e.g., a logic zero state). This quiescent state does not pass any signal through coupling capacitors which couple the output of the amplifier to two separate reference voltage nodes. The reference voltage nodes each bear a voltage set by a respective voltage divider. A third voltage divider sets a common reference voltage. When the incoming signal experiences a state transition such as, for example, a first transition of an incoming data burst, the hysteretic amplifier rapidly raises the output voltage at its output. This causes a transient voltage response that passes through the coupling capacitors to the first and second voltage reference nodes. The transient voltage changes the relationship of the voltage on each of these nodes to the voltage on the common reference node. This change in relationship is detected by first and second respective comparators to produce first and second XOR gate input signals. The first and second XOR gate input signals are received at respective inputs of an XOR gate to produce a first signal detection output. Whenever the incoming signal is quiescent, this signal detection output is in a logic 0 state. Whenever the incoming signal is experiencing frequent transitions, this signal detection output is in a logic 1 state. Because the signal detection output may be glitchy, it is passed through a deglitching device to produce a final signal presence detection signal.

The present invention together with the above and other advantages may best be understood from the following detailed description of the embodiments of the invention illustrated in the following drawings.

BRIEF DESCRIPTION OF THE DRAWINGS

FIG. 26 shows, in electrical schematic diagram form, a portion of a signal detector device including a double ended hysteretic amplifier according to one embodiment of the invention;

FIG. 27 shows, in electrical schematic diagram form, a portion of a signal detector device including a double ended hysteretic amplifier according to one embodiment of the invention;

DETAILED DESCRIPTION

The following description is provided to enable a person of ordinary skill in the art to make and use the disclosed inventions and sets forth the best modes presently contemplated by the inventors for carrying out their inventions. In the following description, for purposes of explanation, numerous specific details are set forth in order to provide a thorough understanding of the described inventions. It will be apparent to one skilled in the art, however, that the inventions may be practiced without these specific details. In other instances, structures and devices are shown in block diagram (or otherwise simplified) form for clarity of presentation.

In the following discussion, the singular term "signal" and plural term "signals" are used interchangeably and are to be understood as including analog or digital information, at a single frequency or a plurality of frequencies, and may or may not include coding, modulation, sideband information, or other features of signals or waveforms well known in the art. Furthermore, when reference is made to a "receiver," "transmitter," "output," or "input," previous process steps may have been utilized to form signals or waveforms compatible with these features. In addition, no particular order is required for the method steps described below, with the exception of those logically requiring the results of prior steps. Otherwise, enumerated steps are provided below in an exemplary order which may be altered, for instance the several receiving steps may be rearranged or performed simultaneously.

Figure 3:
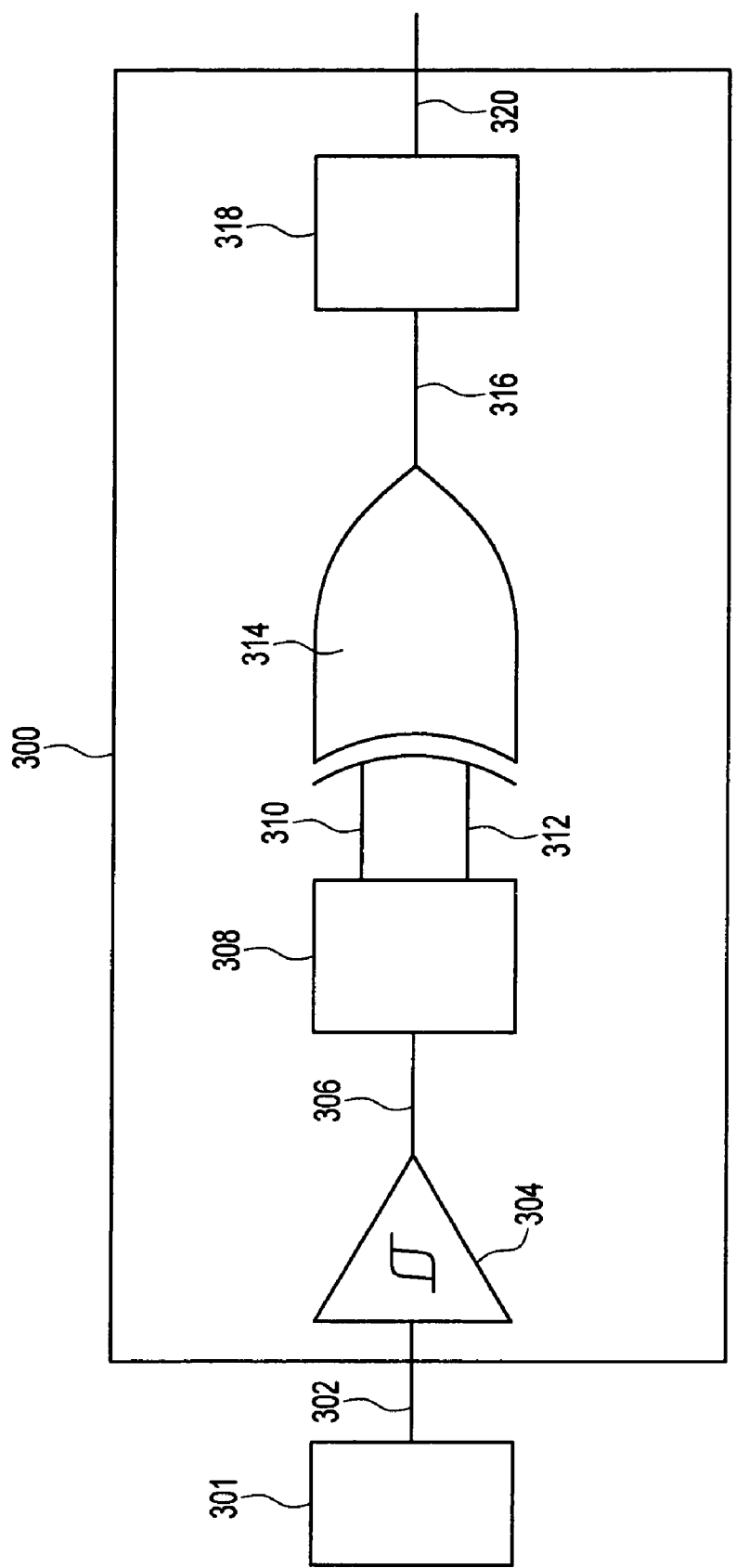
FIG. 3 shows, in block diagram form, a signal presence detector device according to one embodiment of the invention.

FIG. 3 shows, in block diagram form, a portion of a signal presence detector device 300 according to one embodiment of the invention. The signal presence detector device 300 includes an input node 302 that is adapted to be coupled to a signal source 301. The input node 302 is also coupled to an input of a signal conditioner device 304 such as, for example, a Schmitt trigger amplifier. A further node 306 is mutually coupled to an output of the signal conditioner device 304 and an input of a transition detector device 308. The transition detector device 308 has first 310 and second 312 outputs coupled to respective first and second inputs of a logic gate device 314. As illustrated, the logic gate device 314 is an Exclusive OR (XOR) logic gate device. A further node 316 is mutually coupled to an output of the XOR logic gate device, and to an input of a signal de-glitch device 318. The signal de-glitch device 318 has an output that is coupled to an output node 320 of the signal presence detector device 300. The signal presence detector 300 is adapted to provide a signal presence output signal at output node 320 within a short time interval after a first transition of a signal is received at input node 302.

The operation of the signal presence detector device 300 will be understood more clearly when the block diagram of FIG. 3 is examined in conjunction with FIGS. 2 and 4A-5.

Referring again to FIG. 2, one sees, in graphical time domain form, a portion of a signal 200 such as a binary digital signal that might be received at input node 302 of the signal presence detector 300.

Figure 1:
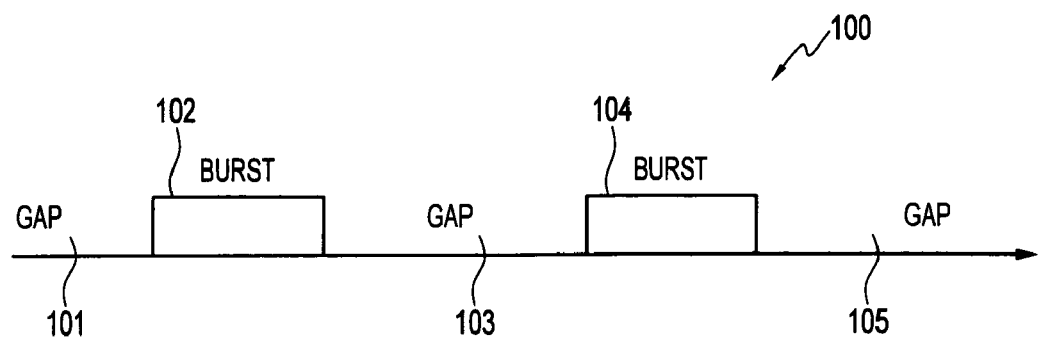
FIG. 1 shows, in graphical time domain form, a plot of a portion of a datastream signal including a data burst portion and a data gap portion.
Figure 2:
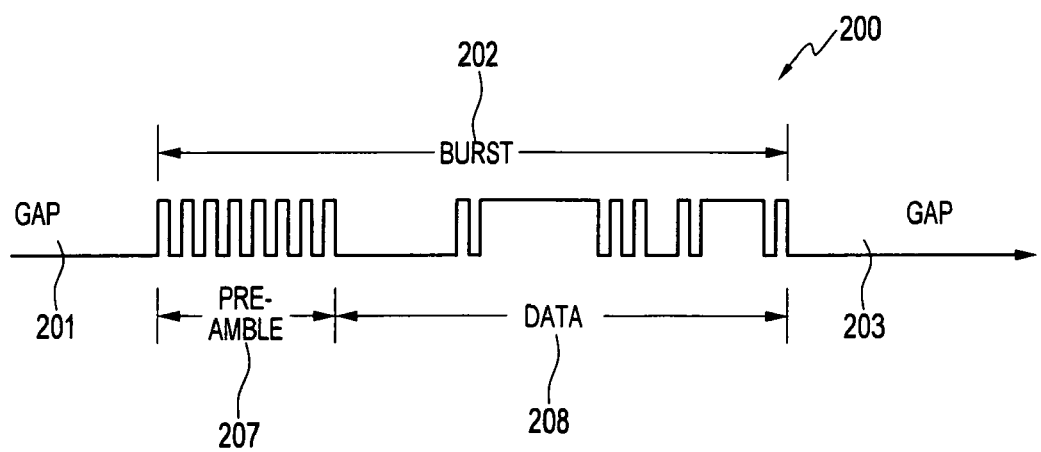
FIG. 2 shows, in graphical time domain form, a plot of a portion of a datastream including a data burst portion and a data gap portion.
Figure 4A:
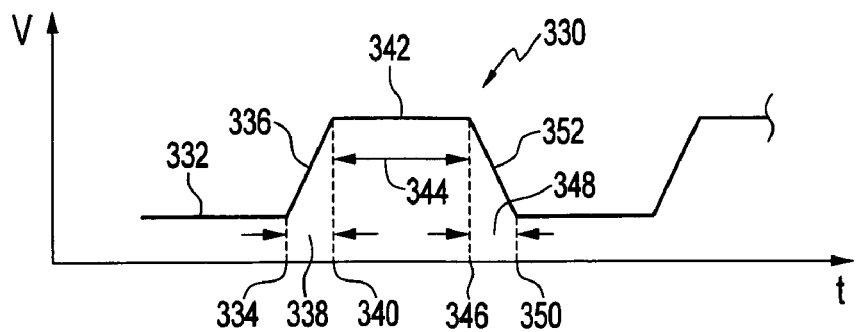
FIG. 4A-4D shows, in graphical time domain form, various signals related to an operation of a signal presence detector device according to one embodiment of the invention.

FIG. 4A shows, in graphical time domain form, a magnified portion of a signal 330, similar to signal 200 as illustrated in FIG. 2. Signal 330 includes a first quiescent portion 332 corresponding to, for example, a gap in a datastream. At a first time 334 a first signal transition 336 is received at input 302 of the signal presence detector device 300. The skilled reader will appreciate that the horizontal scale (i.e., timescale) of FIG. 4A is adjusted to more clearly illustrate the operation of the signal presence detector 300. The timescale is expanded to show the rise time 338 of signal transition 336. At a second time 340, the first signal transition 336 is complete. Thereafter, signal 330 remains in a logic high state 342 for a second time interval 344. During a third time interval 348, between a third time 346 and a fourth time 350, a falling signal transition 352 is received at input 302.

Figure 4B:
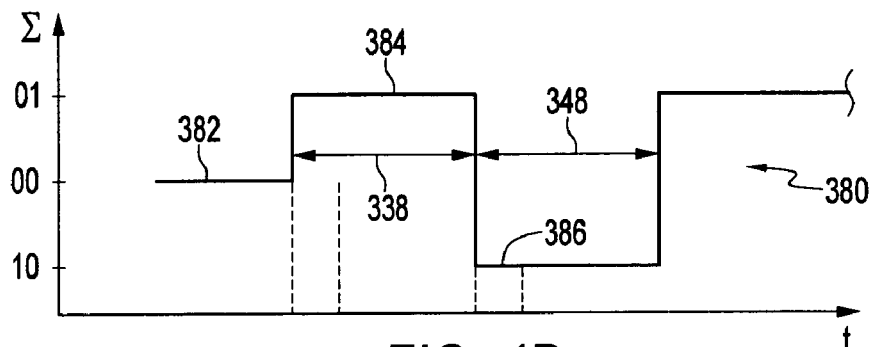

FIG. 4B shows, in graphical time domain form, a state diagram 380 illustrating an output state of the transition detector 308. As seen in state diagram 380, the outputs of transition detector 308 can exhibit three possible output states 00, 01 and 10.

In a first output state 382 of transition detector 308, output node 310 exhibits a logic 0 (or logic low) output and output node 312 exhibits a logic 0 output.

In a second output state 384 of transition detector 308, output node 310 exhibits a logic 0 output and output node 312 exhibits a logic 1 (or logic high) output.

In a third output state 386 of transition detector 308, output node 310 exhibits a logic 1 output and output node 312 exhibits a logic 0 output.

The transition detector 308 produces output state 382 when signal 330 is substantially quiescent (e.g., during a data gap). Transition detector 308 produces output state 384 during a rising transition of signal 330 and output state 386 at a subsequent falling transition of signal 330. Accordingly, as illustrated in FIG. 4B state diagram 380 includes a first portion in state 384 during time interval 338 and a second portion in state 386 during time interval 348.

Figure 5:
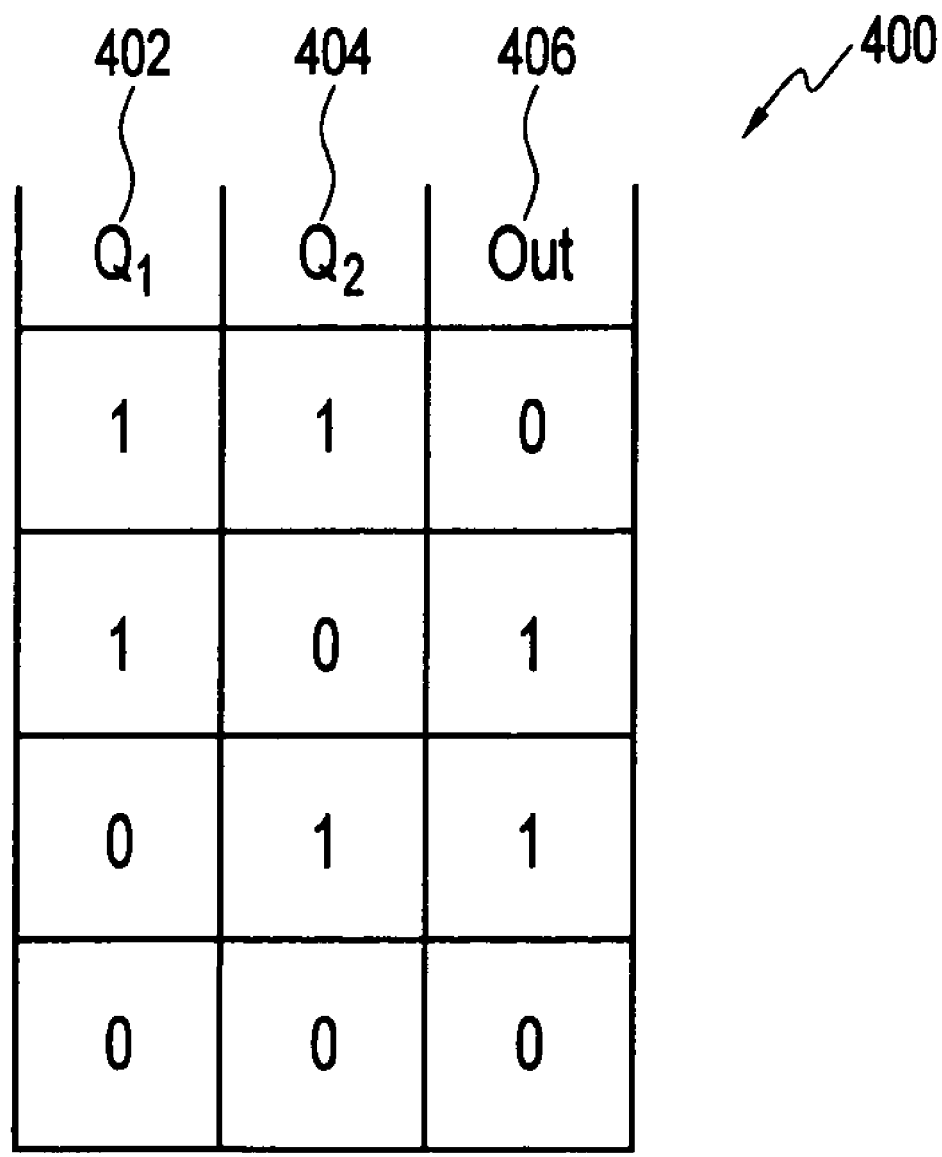
FIG. 5 shows, in tabular form, a logic response of an XOR logic gate device.

Referring to FIG. 5, one sees a logic table 400 for an XOR logic gate. The logic table 400 includes a first column 402 including first XOR gate inputs, a second column 404 including second XOR gate inputs and a third column 406 including XOR gate outputs. Accordingly, the rows of table 400 show the output states produced by a two input XOR gate in response to the illustrated input states.

Figure 4C:
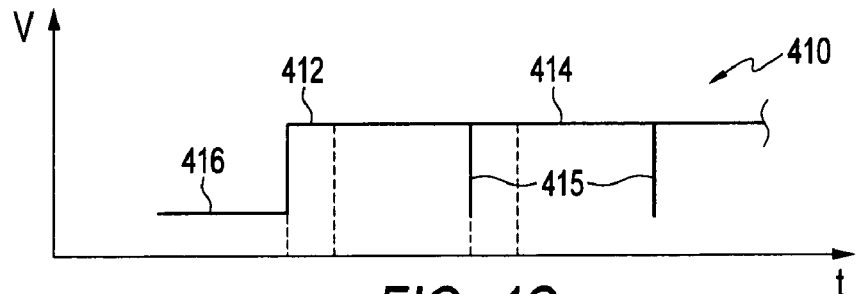

FIG. 4C shows, in graphical time domain form, an output signal 410 produced by, for example, logic gate 314 of FIG. 3. With reference to logic table 400 (FIG. 5) and FIG. 3-4C one sees that during time interval 338, state 384 causes a logic 1 output state 412 at output 316 of XOR gate 314. Similarly, during time interval 348 state 386 causes a logic 1 output state 414 at output 316. Concurrent with state 382, of state diagram 380 signal 410 is in a logic 0 state 416. In contrast, when signal 330 is stable in a logic 0 state 332 or a logic 1 state 342, output 316 has a logic 0 state 416.

It should be noted that, during a transition from logic state 384 to logic state 386, signal 410 may exhibit a glitch 415.

Figure 4D:
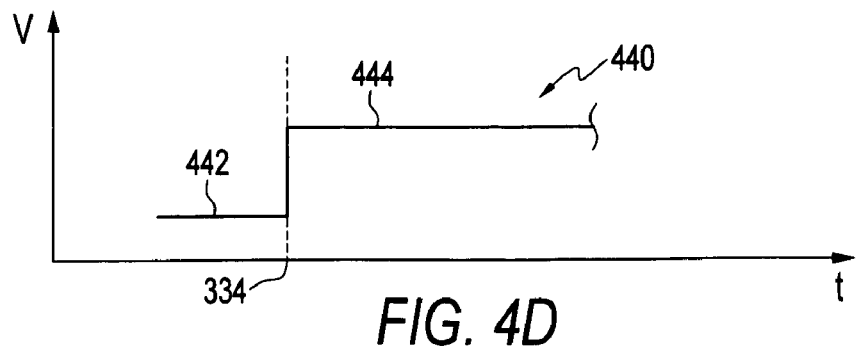

FIG. 4D shows, in graphical time domain form, an output signal 440 at, for example, output node 320. Signal 440 corresponds to signal 410, absent glitches 415.

During a gap in a datastream output signal 440 will fall to a logic 0 voltage 442. During a data burst, however, the output signal 440 remains in its logic 1 state 444. As such, output signal 440 serves as a signal presence detection signal that is inactive during a data gap and becomes active shortly after the arrival of a first transition of a data burst.

Figure 6:
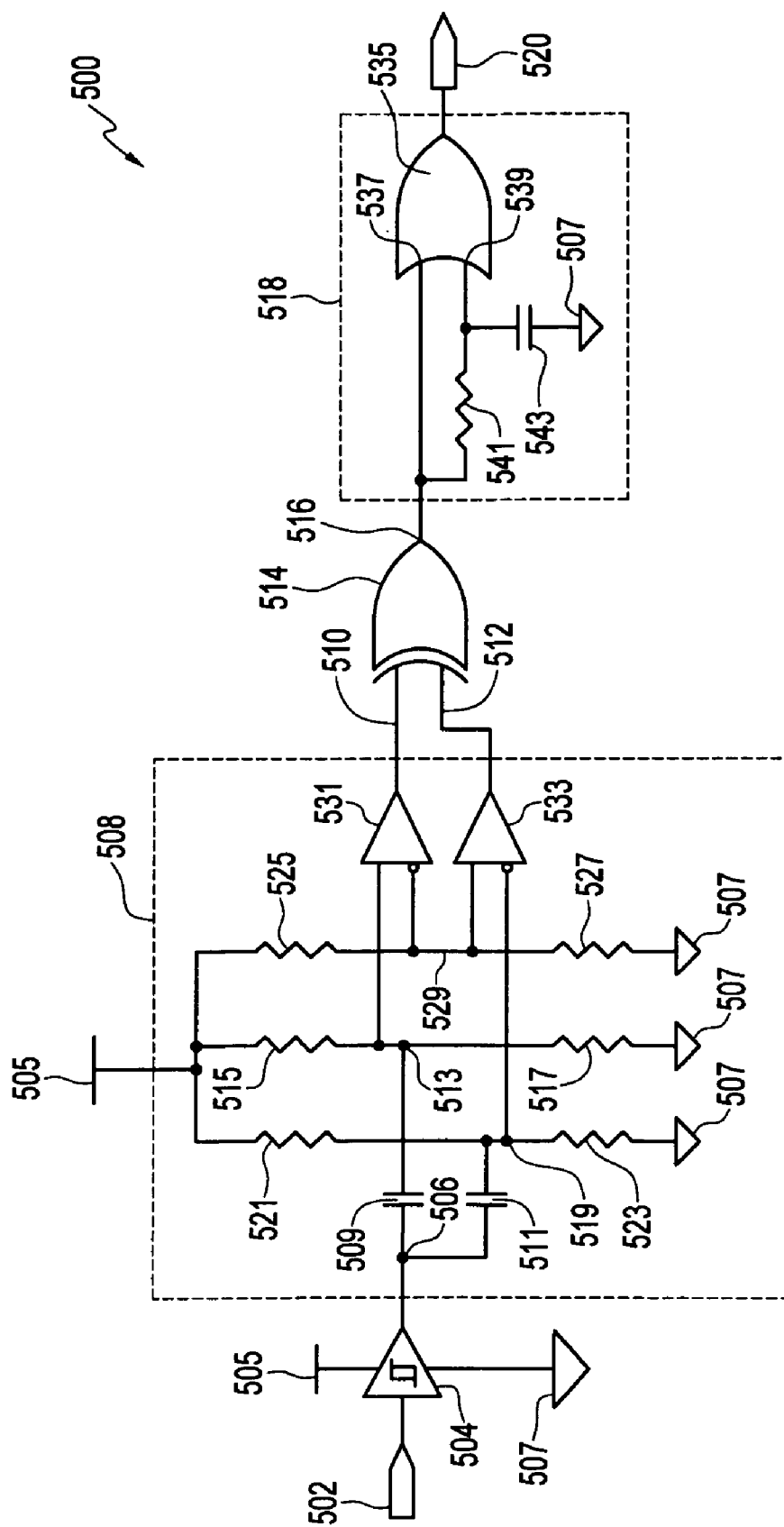
FIG. 6 shows, in electrical schematic diagram form, a portion of a signal detector device according to one embodiment of the invention.

FIG. 6 shows, in schematic circuit diagram form, a portion of a signal presence detector device 500 according to one embodiment of the invention. The signal presence detector 500 includes an input node 502 that is adapted to be coupled to a signal source. The input node 502 is coupled to an input of a signal conditioner device 504. According to one embodiment of the invention, the signal conditioning device 504 is a high-gain limiting amplifier. The limiting amplifier has a hysteretic input, requiring a minimum peak to peak transition on the input signal to cause a change of state in the amplifier's output signal. The output of the limiting amplifier swings between two states, or logic levels, defined by the technology used. The limiting amplifier is a very high gain, very wide-band amplifier wherein a transition in the input signal that is greater than a minimum defined by the hystresis circuit causes a full state reversal in the output of the amplifier. In the illustrated embodiment, the signal conditioning device is a single-ended amplifier adapted to operate between a source of supply voltage 505 and a source of ground potential 507. In other embodiments, as will be discussed below in additional detail, a double-ended (or differential) amplifier with complementary outputs is employed.

Due to the properties of the limiting amplifier 504, a sinewave at the input to the limiting amplifier 504 results in a square wave output from the amplifier. Other waveforms received at the input to the limiting amplifier 504 result in corresponding rectangular waveforms at its output.

The output of the signal conditioner device 504 is coupled to a transition detector device 508. In the illustrated embodiment, the transition detector device 508 includes first 509 and second 511 capacitive devices mutually coupled at a node 506 to the output of the signal conditioner device 504.

Capacitive device 509 is also coupled to a node 513 that is mutually coupled to a first resistive device 515 and a second resistive device 517. Capacitive device 511 is similarly also coupled to a node 519. Node 519 is further mutually coupled to a third resistive device 521 and a fourth resistive device 523. A fifth resistive device 525 is mutually coupled to a sixth resistive device 527 at a further node 529. In the illustrated embodiment, resistive devices 517, 523 and 527 are respectively coupled to the source of ground potential 507. In like fashion, resistive devices 515, 521 and 525 are mutually coupled to the source of supply voltage 505.

In a further aspect, the transition detector device 508 includes a first comparator device 531 and a second comparator device 533. Comparator device 531 has a first non-inverting input coupled to node 513 and a second inverting input coupled to node 529. Comparator device 533 has a third non-inverting input coupled to node 529 and a fourth inverting input coupled to node 519. An output of comparator device 531 and an output of comparator device 533 form first 510 and second 512 output nodes respectively of the transition detector device 508.

Nodes 510 and 512 are coupled to respective inputs of a logic gate device 514. The logic gate device 514 has an output 516 that is coupled to an input of a de-glitch device 518. In the illustrated embodiment, the logic gate device 514 is an XOR logic gate device. Accordingly, the logic gate device 514 is adapted to produce an output signal at output 516 that corresponds to respective input signals at nodes 510 and 512 following the logic table of FIG. 5.

The de-glitch device 518 includes, in the illustrated example, an OR logic gate device 535 with an input 537 connected directly to node 516 and a second input 539 coupled to node 516 through a resistive device 541. Input 539 is also coupled through a capacitive device 543 to the source of ground potential 507. An output of the OR logic gate device 535 is coupled to an output node 520 of the signal presence detector device 500.

In operation:

According to one embodiment of the invention, resistive devices 525 and 527 form a voltage divider to establish a reference voltage at node 529. In one embodiment, resistive device 525 has a resistance equal to a resistance of resistive device 527. Accordingly, the voltage at node 529 is substantially equal to one half the voltage of the source of supply voltage 505 (VCC/2) according to the formula:

$$V_{529} = \frac{V_{CC} \times R}{R+R} = \frac{V_{CC}}{2}$$

where resistive device 525 and resistive device 527 each have a resistive value R.

In one embodiment of the invention resistive devices 515 and 523 have a nominal value R(1+X). Resistive devices 517 and 521 have a nominal value of R. One of skill in the art will immediately understand that resistive devices 515 and 523 each has a resistive value greater by X percent as compared with the respective resistance values of resistive devices 517, 521, 525 and 527.

Consequently, resistive device 515 forms a voltage divider with resistive device 517 such that a voltage at node 513 is given by the formula:

$$V_{513} = \frac{V_{CC} \times R}{R+R(1+X)} = \frac{V_{CC}}{2+X} < \frac{V_{CC}}{2}$$

In like fashion, resistive device 521 forms a voltage divider with resistive device 523 such that a voltage at node 519 is given by the formula:

$$V_{519} = \frac{V_{CC} \times R(1+X)}{R+R(1+X)} = \frac{V_{CC} \times (1+X)}{2+X} > \frac{V_{CC}}{2}$$

These voltages are the steady-state DC biasing voltages at nodes 513 and 519 respectively, when no signal is being received at input node 502 (e.g., during a data gap time interval).

Figure 7:
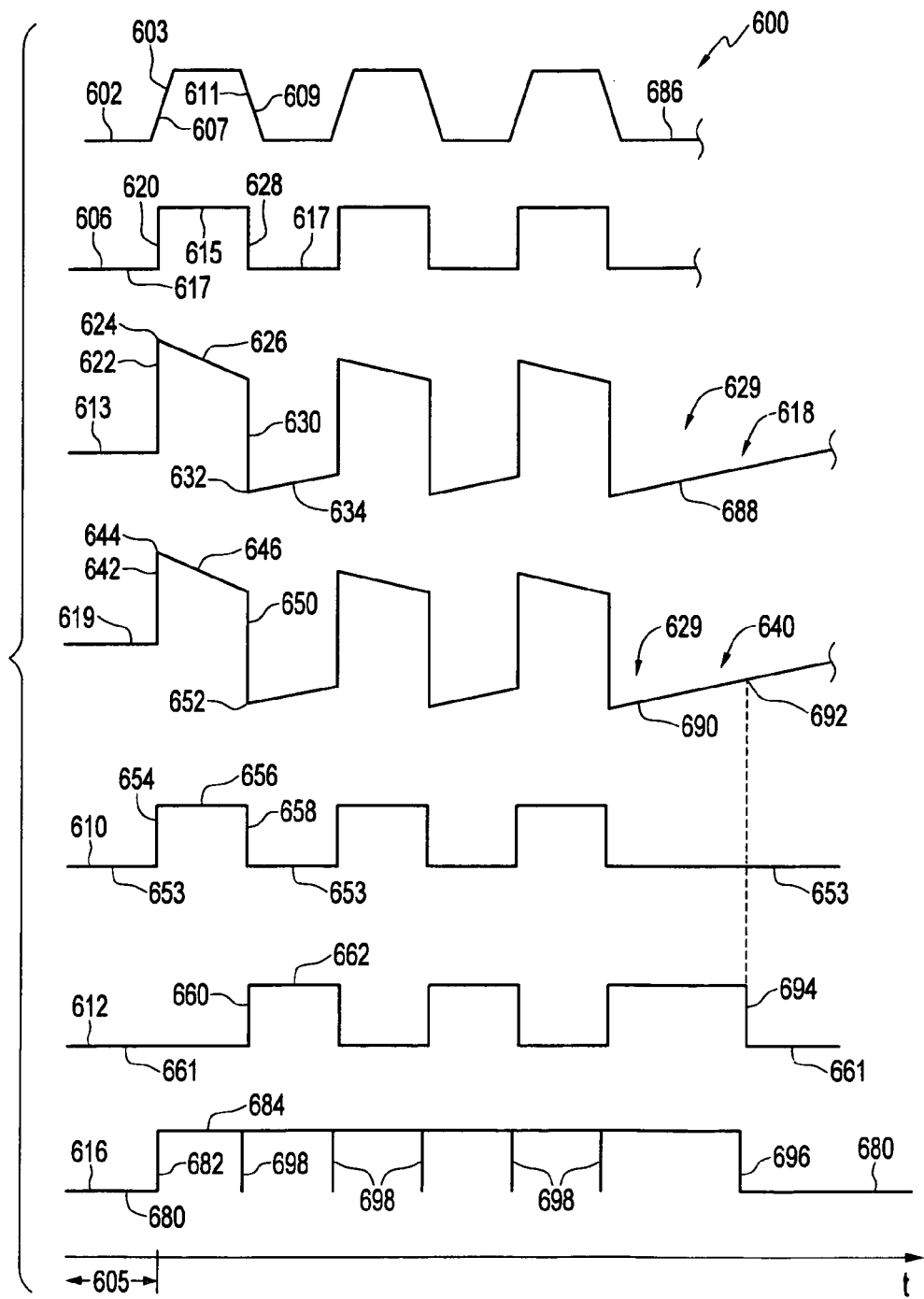
FIG. 7 shows, in graphical time domain form, various signals related to an operation of a signal presence detector device according to one embodiment of the invention.

Referring now to FIGS. 6 and 7, the operation of one embodiment of the signal presence detection device 500 will be described in additional detail. When no signal is received at node 502 as, for example, during a gap in a data stream, node 513 settles at a voltage slightly below a voltage of reference node 529 and node 519 settles at a voltage slightly above a voltage of reference node 529. As a first (e.g., rising) transition of a data burst arrives, that transition is rapidly amplified to full-scale voltage by the fast amplifier 504. The transient component of this rapid transition passes through the coupling capacitors 509 and 511 and disturbs the respective voltages at nodes 513 and 519. Here, because the transition is a rising transition, the respective voltages at nodes 513 and 519 are augmented. Since the voltage of node 519 is already above the reference voltage at node 529, augmentation of the voltage at node 519 does not affect an output state of the comparator device 533. Because the voltage of node 513 starts below the reference voltage at node 529, augmenting the voltage at node 513 to a level above the reference voltage causes a state transition at the output of the comparator device 531. This transition, in turn, causes a state transition at the output 516 of the XOR gate device 514, and indicates the arrival of the data burst.

As indicated above, the steady-state voltage at node 513 is less than the reference voltage at node 529 of one half the supply voltage 505 (Vcc/2). As also indicated above, the steady-state voltage at node 519 is greater than the reference voltage at node 529 (Vcc/2). Consequently, when the signal transition detector 508 is in steady-state, as for example during a data gap time interval 605 (a shown on FIG. 7), the non-inverting input of comparator device 531 detects a lower voltage than the inverting input of the same comparator device.

FIG. 7 shows, in graphical form, a time domain representation of voltage signals 600 found at various nodes within the signal presence detector device 500 of FIG. 6. Signal 602 shows an exemplary input signal received at input node 502. One of ordinary skill in the art will appreciate that, for purposes of illustration, signal 602 is presented on a non-linear timescale so as to make the rise and fall times associated with signal transitions visible. A first rising transition 603 of a data burst after a data gap 605 is illustrated. As the signal 602 rises in transition 603, its value crosses a first trigger threshold 607 of hysteretic amplifier 504. At a later time signal 602 has a first falling transition 609. During this falling transition 619, the value of signal 602 crosses a second trigger threshold 611 of hysteretic amplifier 504. Crossing the first 607 and second 611 thresholds of amplifier 504 causes an output of the amplifier to rapidly change state.

Signal 606 shows the output of amplifier 504 as received at node 506. As illustrated, signal 606 rises from a first low-voltage state 617 to a second higher-voltage state 615 when signal 602 crosses threshold 607. Signal 606 falls from the second higher-voltage state 615 to low-voltage state 617 when signal 602 crosses threshold 611. One of ordinary skill in the art will appreciate that the threshold values 607 and 611, and the resultant timing of the transitions of signal 606, will be selected in various embodiments to meet the needs of a particular application. Such selection will generally be a matter of technical routine.

Signal 613 illustrates a signal at node 513 received from output 506 of amplifier 504 through capacitive device 509. During a data gap 605 node 513 is in steady-state DC mode with a voltage 618 established by the voltage divider including resistive devices 515 and 517. Voltage 618 is lower than a reference voltage 629 found at node 529 because resistive device 515 has a larger resistance than resistive device 517. When amplifier 504 makes its first state transition 620 a transient voltage passes through capacitive device 509 to node 513. Responsively, signal 613 has a first rising state transition 622. Rising state transition 622 causes signal 613 to rise above reference voltage 629 to a peak voltage 624. Thereafter, the voltage of signal 613 diminishes 626 according to an RC time constant that is related to a capacitance of capacitive device 509 and to a resistance of resistive device 517.

The RC time constant is selected so that diminishing voltage 626 remains substantially above reference voltage 629 for one or more, and in various embodiments many, bit times. Thereafter, before signal 613 has diminished to reference voltage 629, a further output transition 628 of amplifier 504 sends a further transient through capacitive device 509. In response to this further transient, signal 613 makes a rapid falling transition 630 to a voltage 632 below reference voltage 629. From voltage 632, signal 613 again converges 634 towards steady-state voltage 618.

Signal 619 illustrates a signal at node 519 received from output 506 of amplifier 504 through capacitive device 511. During a data gap 605 node 519 is in steady-state DC mode with a voltage 640 established by the voltage divider including resistive devices 521 and 523. Voltage 640 is higher than the reference voltage 629 found at node 529 because resistive device 521 has a smaller resistance than resistive device 523. When amplifier 504 makes its first state transition 620, the transient voltage it produces passes through capacitive device 511 to node 519. Responsively, signal 619 has a first rising state transition 642. Rising state transition 642 causes signal 619 to rise to a voltage peak 644. It should be noted that since voltage 640 is higher than reference voltage 629, this transition does not cause the signal 619 to pass through the reference voltage 629. Thereafter, the voltage of signal 619 diminishes 646 according to an RC time constant that is related to a capacitance of capacitive device 511 and to a resistance of resistive device 523.

The RC time constant is selected so that diminishing voltage 646 remains substantially above reference voltage 629 for one or more, and in various embodiments many, bit times. Thereafter, before signal 619 has diminished to reference voltage 629, a further output transition 628 of amplifier 504 sends a further transient through capacitive device 511. In response to this further transient, signal 619 makes a rapid falling transition 650 to voltage 652 below reference voltage 629. From voltage 652, signal 619 again converges towards steady-state voltage 640.

Referring again to the signal presence detection device 500 of FIG. 6, one sees that comparator device 531 is adapted to receive signal 613 at a first non-inverting input and reference voltage 629 at a second inverting input. The comparator produces a signal 610 at its output, as illustrated in FIG. 7. Signal 610 has a logic 0 state 653 during data gap time interval 605. When rising transition 622 of signal 613 exceeds reference voltage 629, signal 610 has a rising state transition 654 to a logic 1 state 656. Signal 610 maintains this logic 1 state 656 substantially until falling transition 630 of signal 613 falls below reference voltage 629. Thereafter, signal 610 has a falling state transition 658 back to the logic zero state 653.

Once again referring to the signal presence detection device 500 of FIG. 6, one sees that the comparator device 533 is adapted to receive signal 619 at an inverting input and reference voltage 629 at a non-inverting input. The comparator produces a signal 612 at its output, as illustrated in FIG. 7. Signal 612 has a logic 0 state 661 during gap time interval 605. This logic state 0 persists after rising transition 642 takes place, because signal 619 has a DC steady-state value 640 during gap time interval 605 that is higher than reference voltage 629. Accordingly, transition 642 of signal 619 does not pass through reference voltage 629. Thereafter, 612 remains at logic state 0 until falling transition 650 of signal 619 crosses reference voltage 629, at which time signal 612 has a rising transition 660 to logic high state 662.

Referring once again to FIG. 6, one see that signals 610 and 612 are received at respective inputs of XOR logic gate device 514. An output signal present at output 516 of XOR logic gate device 514 is illustrated as a signal 616 of FIG. 7. During gap time interval 605 signal 616 has a logic 0 state 680. This logic 0 state corresponds to signal 610 and signal 612 both having respective logic 0 states 653, 661. Referring again to the XOR logic table of FIG. 5, one sees that two logic 0 inputs produce a logic 0 output. When rising signal transition 654 occurs, signal 610 and 612 have logic 1 and logic 0 states respectively.

Referring to FIG. 5, one sees that a logic 1 input and a logic 0 input produce a logic 1 output. Accordingly, signal 616 makes a rising signal transition 682 to logic 1 state 684. When signal 610 makes a falling signal transition 658, signal 612 substantially simultaneously make a rising signal transition 660 so that signal 610 enters a logic 0 state 653 and signal 612 enters a logic 1 state 662. Referring again to FIG. 5, one sees that a logic 0 input and a logic 1 input produce a logic 1 output. Accordingly, signal 616 remains in a logic 1 state 684 after signal transition 658 and 660.

It should be noted that rising state transition 682 of signal 616 takes place very soon after rising transition 603 of input signal 602 begins. Unlike a conventional signal presence detection device, which requires an integration time before a received signal can be detected, the delay between transition 607 and transition 682 is due only to such factors as active device rise times and transmission delays due to, for example, the parasitic capacitance of inter-device conductors. Accordingly, a signal presence detector device, as exemplified in the described embodiments, can provide very fast response to the arrival of incoming data bursts or other incoming signals.

The logic 1 state 684 of signal 616 persists substantially until after the data burst of signal 602 is complete, and signal 602 resumes a more or less persistent logic 0 (data gap) state 686. Thereafter, signal 613 converges 688 to its steady-state DC value 618 and signal 619 converges 690 to its DC steady-state value 640. Depending on whether this convergence 688, 690 takes place from a high-voltage or low-voltage direction, one or the other of signal 613 and 619 will cross the reference voltage 629. As illustrated in FIG. 7, signal 619 crosses the reference voltage 629 at a time 692 to trigger a downward transition 694 of signal 612. This downward transition places signal 612 into the same logic 0 state 661 as logic 0 state 653 of signal 610. As dictated by the XOR logic table of FIG. 5, signal 616 transitions 696 to logic 0 state 680.

One of ordinary skill in the art will appreciate that various factors will tend to desynchronize the signal transitions of signals 600. For example, signal transitions 630 and 650 and corresponding state transitions 658 and 660 can be desynchronized from one another. Such desynchronization can result from, for example, the additional rise time of signal transition 622 as compared to signal transition 642, since signal 622 starts from a slightly lower voltage, or from non-ideal characteristics of a device such as device 500. For example, a capacitance value of capacitive device 509 may be different from a capacitance value of capacitive device 509. In addition, stray or parasitic capacitances may exist in relation to the conductors coupling, for example amplifier 504 to capacitive devices 511 and 511 at node 506. Also, variation in resistance values of resistive devices such as resistive devices 515, 517, 521, 523, 525 and 527 may result from manufacturing tolerances, random variation, or partial device breakdown. One of ordinary skill in the art will appreciate that there are myriad possible sources of variation within a device such as device 500.

If these variations result in the above noted desynchronization of signal transitions, momentary transitions, or glitches 698, may occur in signal 616. These glitches all have the potential to cause an undesirable loss of signal presence output. Accordingly, device 500 includes a deglitch device 518.

In the embodiment illustrated in FIG. 6, deglitch device 518 includes an OR logic gate device 535 with a first input 537 that receives signal 616 directly from output 516 of XOR gate device 514. Device 535 also includes a second input that receives signal 616 through and integrating device including a resistive device 541 and a capacitive device 543. Operation of the deglitch device 518 will be better understood with reference to FIG. 8.

Figure 8:
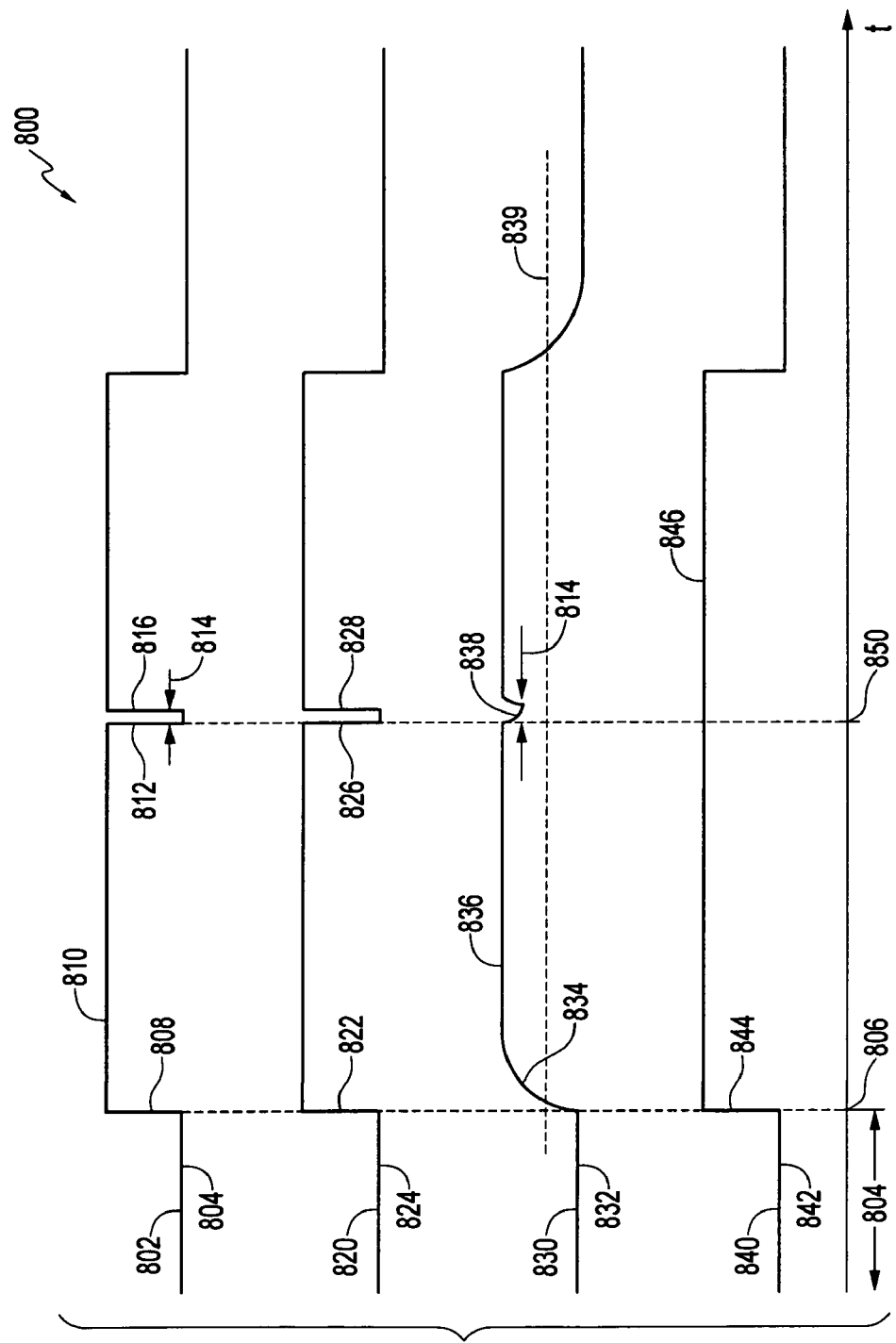
FIG. 8 shows, in graphical time domain form, various signals related to an operation of a signal presence detector device according to one embodiment of the invention.

FIG. 8 shows, in graphical form, a time domain representation 800 of the signal states at inputs 537 and 539 and a corresponding output state at node 520. The response to a received signal glitch like glitch 698 of signal 616 (as shown in FIG. 7) is shown. Signal 802 shows a portion of an output signal produced by an XOR logic gate according to one embodiment of the invention. During a data gap time interval 804 signal 802 maintains a logic 0 level 804. Upon detection of a first transition of an incoming data burst at approximately time 806, signal 802 rapidly makes a rising transition 808 to a logic 1 state 810.

Signal 820 shows the corresponding state of input 537 of OR logic gate device 535. Because input 537 is directly connected to output 516, signal 820 is substantially identical to signal 802. Accordingly, during data gap time interval 804, signal 820 is in a logic 0 state 824. When signal 802 makes the rising transition 808 signal 820 substantially immediately has a corresponding rising transition 822.

Signal 830 corresponds to a voltage signal received at input 539 of OR logic gate device 535. As indicated, during data gap time interval 804 signal 830 is also in a logic 0 state 832. When signal 802 makes the rising transition 808, signal 830 does not rise precipitously the way signal 820 does. Rather, because of the RC circuit arrangement, including resistive device 541 and capacitive device 543, signal 830 rises more slowly 834 after time 806, according to the corresponding RC time constant. Ultimately, signal 830 approaches a logic 1 state 836.

Signal 840 shows a voltage state of node 520 at the output of OR gate device 535. During gap time interval 804, signal 840 is in a logic 0 state 842. One of ordinary skill in the art will appreciate that the output of an OR gate device will have a logic 1 state whenever one or the other or both of its inputs detect a logic 1 state. Accordingly, at time 806 signal 840 has a rising signal state transition 844 in response to rising transition 822.

At some time 850 signal 802 experiences a downward-going glitch transition 812. The downward going glitch transition 812 is followed after a brief time interval 814 by a rising glitch transition 816. Again, because of the direct connection between input 537 and output 516, signal 820 experiences a substantially identical downward-going glitch transition 826 at substantially the same time 850 followed by an upward going glitch transition 828.

At time 850, signal 830 also begins a downward transition 838. This transition 838, however, proceeds according to the RC time constant. Accordingly, after glitch time interval 814 the voltage of signal 830 has not decreased very much from the voltage of the logic 1 state 836. Importantly, after the glitch time interval 814, the voltage of signal 830 has not decreased enough to put signal 830 below a logic threshold voltage 839 of the OR gate device 535. Consequently, the OR gate device 535 detects signal 830 as a logic 1 state at input 539 throughout the glitch time interval 814. As a result, the output signal 840 of the OR gate device 535 does not exhibit any result of the glitch transitions 826, 828, 838 applied respectively at its inputs. Instead, output signal 840 maintains a desirable uninterrupted logic 1 state 846.

Figure 9:
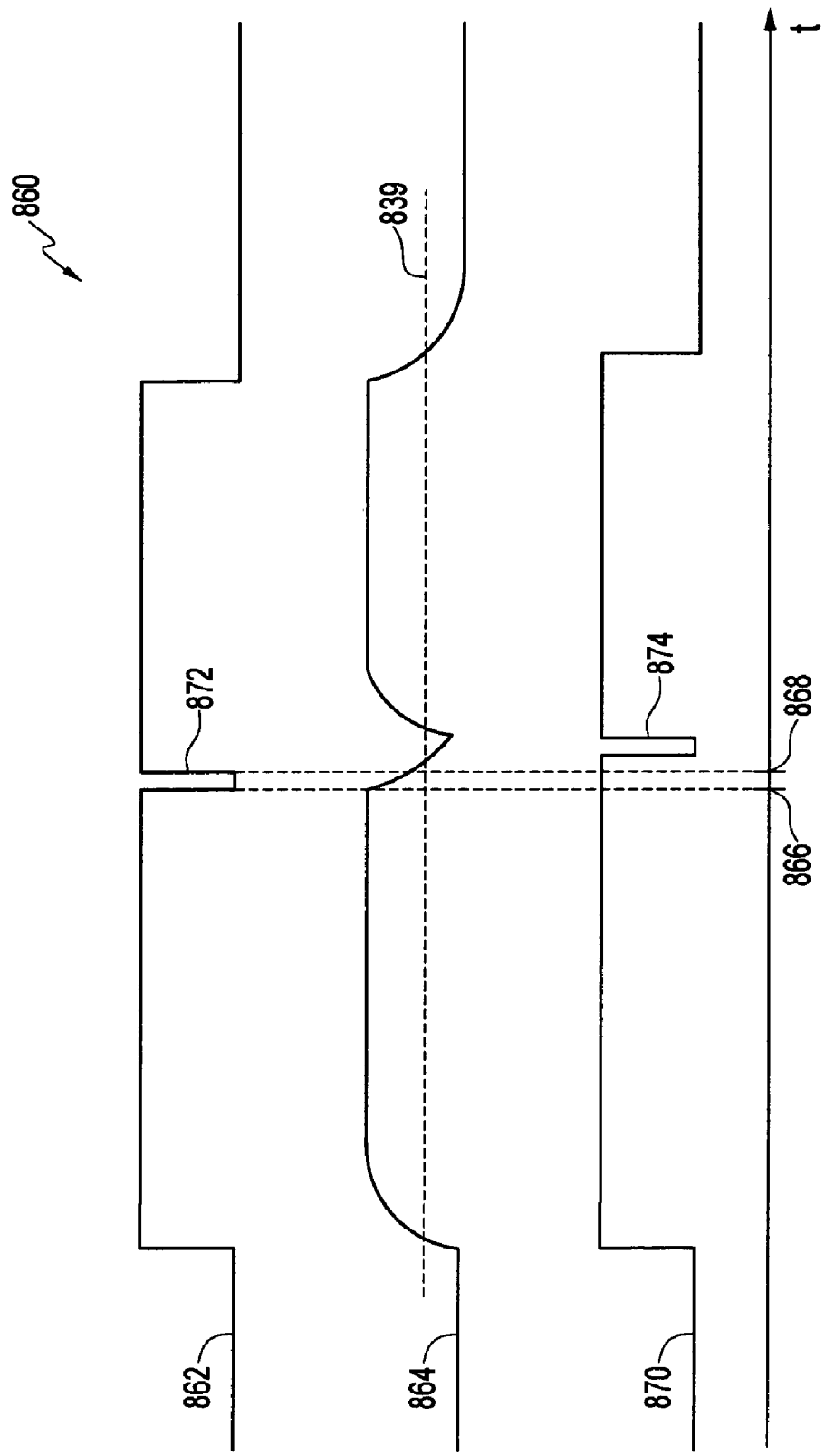
FIG. 9 shows, in graphical time domain form, various signals related to an operation of a signal presence detector device according to one embodiment of the invention.

FIG. 9 shows, in graphical form, the time domain representation of the signal states 860 at inputs 537 and 539 and a corresponding output state at node 520 of FIG. 6 according to other embodiments of the invention. According to the embodiments of FIG. 9, signal 862 represents a signal received at input 537. Signal 864 represents a signal received at input 539. As shown, a glitch is present in signal 862 between a first time 866 and a second time 868. Unlike signal 830 of FIG. 8, signal 864 of FIG. 9 exhibits a glitch that crosses the logic threshold 839 of the OR gate device 535. This crossing, however, is delayed until after time 868. Accordingly, the glitch does not propagate to the output node 520 of the OR gate device 535. One of skill of the art will appreciate that such a result can be achieved by proper selection of the capacitive device 543 and resistive device 541 shown in FIG. 6.

Signal 870 corresponds to still another embodiment of the invention. As shown in FIG. 9, the glitch 872 present in signal 862 at input 537 is also present 874 in signal 870 at input 539. Moreover, the glitch 874 in signal 870 has substantially the same form (rectangular, in the present example) as the glitch 872 of signal 862. Glitch 874, however, has been delayed by, for example, a digital time delay line so as to desynchronize glitch 874 from glitch 872. By ensuring that the falling transition of glitch 874 occurs after the rising transition of glitch 872, the propagation of the glitch 872, 874 to the output node 520 of OR gate device 535 is prevented.

Figure 10:
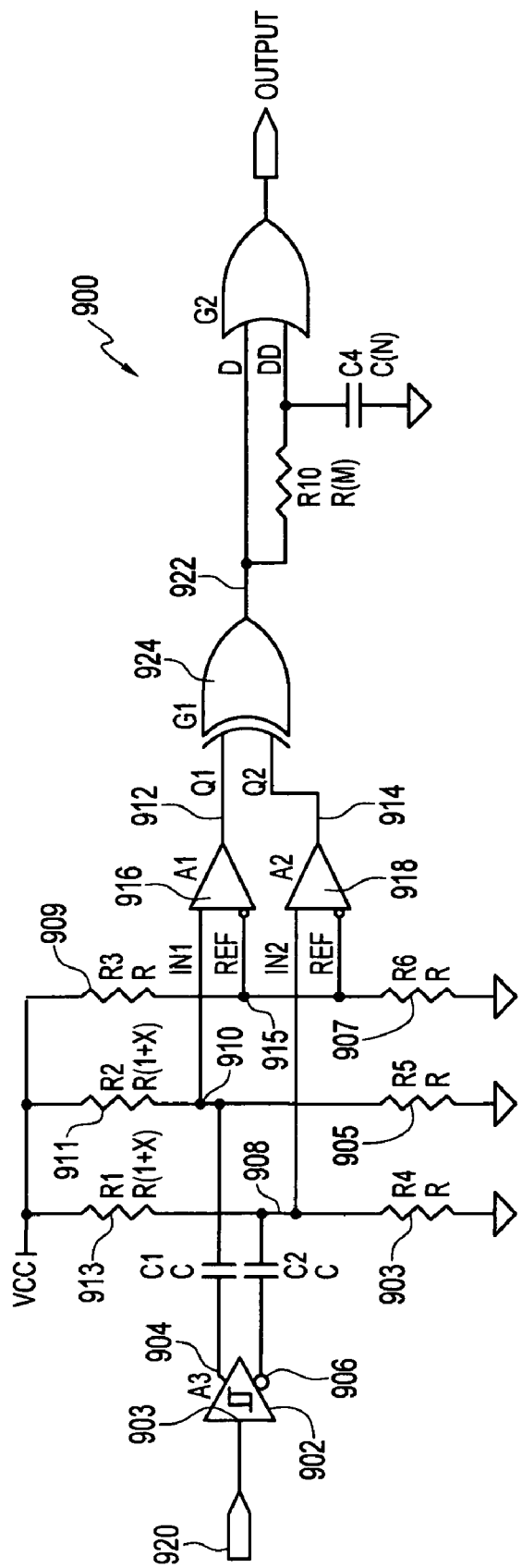
FIG. 10 shows, in electrical schematic diagram form, a portion of a signal detector device according to one embodiment of the invention.

FIG. 10 shows, in electrical schematic diagram form, a signal presence detector device 900 according to another embodiment of the invention. Device 900 includes a hysteretic limiting amplifier 902 with differential complementary outputs 904, 906. The amplifier 902 also has an input 903. One of skill in the art will appreciate that output 904 is a non-inverting output. Accordingly, output 904 is adapted to produce a signal having a polarity that conforms to a polarity of an input signal received at input 903.

Output 906 is an inverting output. Therefore, output 906 is adapted to produce a signal having a polarity that is instantaneously opposite to that of the input signal received at input 903. As a result, when a positive transition occurs on one output (e.g., 904) a transition of identical magnitude, but inverted polarity occurs on the complementary output. Therefore, when a signal is present at the input 903, successions of positive-to-negative and negative-to-positive transitions occur on both complementary outputs 904, 906. It should be noted that, in the double-ended embodiment shown in FIG. 10, resistive devices 903, 905, 907 and 909 have, for example, a first respective resistance R, whereas resistive devices 911 and 913 have, for example, a second respective resistance R(1+X). Consequently, while node 915 is adapted to exhibit a reference voltage of Vcc/2, just as in the single-ended embodiment 500, nodes 908 and 910 both exhibit a DC steady-state value that is less than Vcc/2. Under this arrangement, outputs 912 and 914 are both in a logic 0 state when no signal is present (e.g., during a data gap).

In operation, when one output (e.g., 904) transitions in one direction the other output (e.g., 906) transitions in the opposite direction. As with the single-ended embodiment 500 depicted in FIG. 6, the respective transient portions of the voltage state transitions produced at the outputs 904, 906 disrupt the steady-state conditions otherwise found at nodes 908 and 910. Consequently, as with the single-ended embodiment 500, outputs 912, 914 of comparator devices 916, 918 respectively toggle repeatedly in opposite directions during reception of a signal or data burst at input 920. Again, as in the single ended embodiment 500, this contrary toggling of outputs 912 and 914 results in a substantially continuous logic 1 output at output node 922 of XOR logic gate device 924.

When a positive transition occurs on the non-inverting output 904 of amplifier device 902, node 910 goes more positive with respect to node 915 and the output 912 of comparator device 916 changes its logic state from a logic 0 state to a logic 1 state. Simultaneously, a negative transition occurs on the complementary output 906 of amplifier device 902 causing node 908 to go more negative with respect to node 915. Since node 908 is already negative with respect to node 915 at the time of this negative transition, no change occurs in the logic state at the output 914 of comparator device 918. Thus, the output 914 remains in a logic 0 state.

When a negative transition occurs on the input 920 of amplifier device 902, a positive transition occurs on the complementary output 906 of the amplifier device. Node 908 goes more positive with respect to node 915 and the output 914 of comparator device 918 changes its logic state from a logic 0 state to a logic 1 state. Simultaneously, a negative transition occurs on the non-inverted output 904 of amplifier device 902. This negative transition causes node 910 to go more negative with respect to node 915. Since node 910 is already negative with respect to node 915 at the time of this negative transition, no change occurs in the logic state of the output 912 of comparator device 916. Accordingly, output 912 remains in a logic 0 state.

With the bias set-up shown in device 900 of FIG. 10, when no signal is present (e.g., during a data gap) at the input 920 of amplifier device 902 the respective outputs of both comparators 916, 918 are at an identical logic 0 state. Whenever a signal is present (e.g., during a data burst) at the input 920 of amplifier device 902, outputs 912 and 914 of comparator devices 916 and 918 respectively are complementary. Therefore, while one of output 912 and 914 is in a logic 0 state, the other is in a logic 1 state. As a result, when no signal is present at the input 920 of the amplifier device 902, the output 922 of the XOR gate device 924 exhibits a logic 0 state. Whenever a signal is present at the input 920 of amplifier device 902, however, the output 922 of XOR gate device 924 exhibits a logic 1 state.

The embodiments described in relation to device 500 of FIG. 6 and device 900 of FIG. 10 do not specify any particular logic family, but rather describe the underlying method of using a logic gate device to detect the presence of a signal. Emitter Coupled Logic (ECL) devices are often employed in high-speed communications. These devices are capable of operating with data speeds of several Gigahertz. Some of the newer ECL devices typically use differential interfaces. Accordingly, various embodiments of the invention can be implemented using ECL devices.

Figure 11:
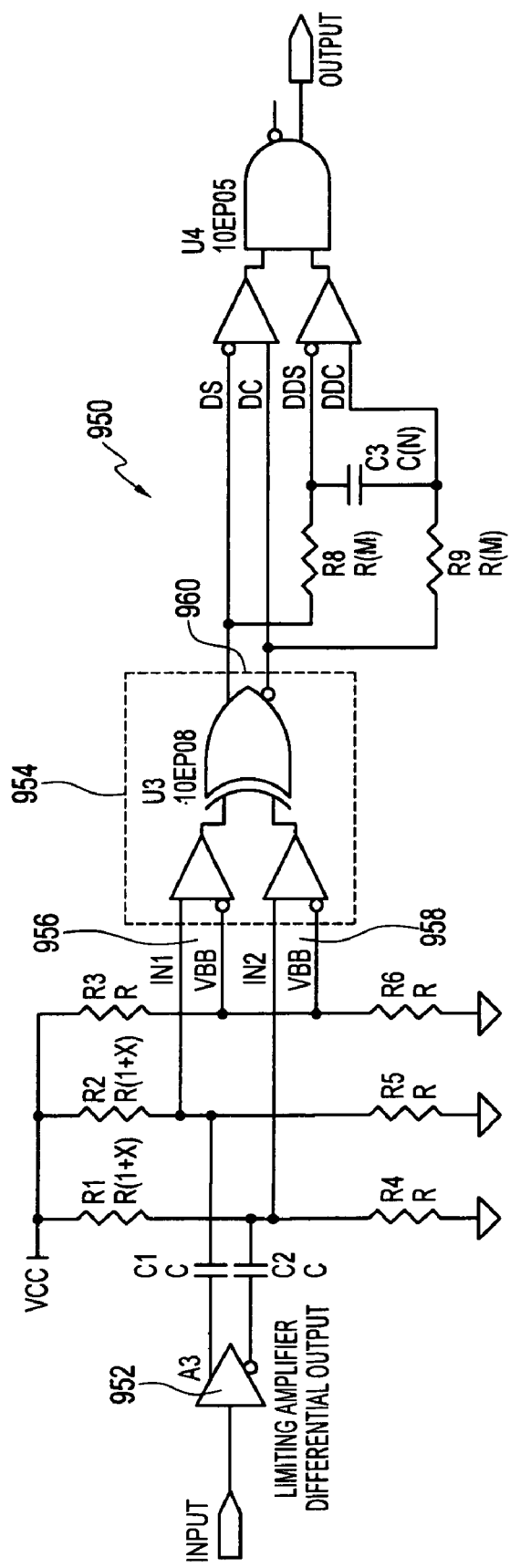
FIG. 11 shows, in electrical schematic diagram form, a portion of a signal detector device according to one embodiment of the invention.

For example, FIG. 11 shows, in schematic circuit diagram form, a signal presence detector device 950 according to another embodiment of the invention. Device 950 includes, for example, a differential output limiting amplifier 952 and a Positive ECL (PECL) XOR gate device 954. According to one embodiment of the invention, XOR gate device 954 provides XOR functionality with differential inputs 956, 958 and a differential output 960. An exemplary device having these characteristics is available from several manufacturers, and is commonly identified as 10EP08. It should be noted that because device 954 has differential inputs, device 950 does not require the comparator devices found in device 500 of FIG. 6 (531, 533) and device 900 of FIG. 10 (916, 918).

Figure 12:
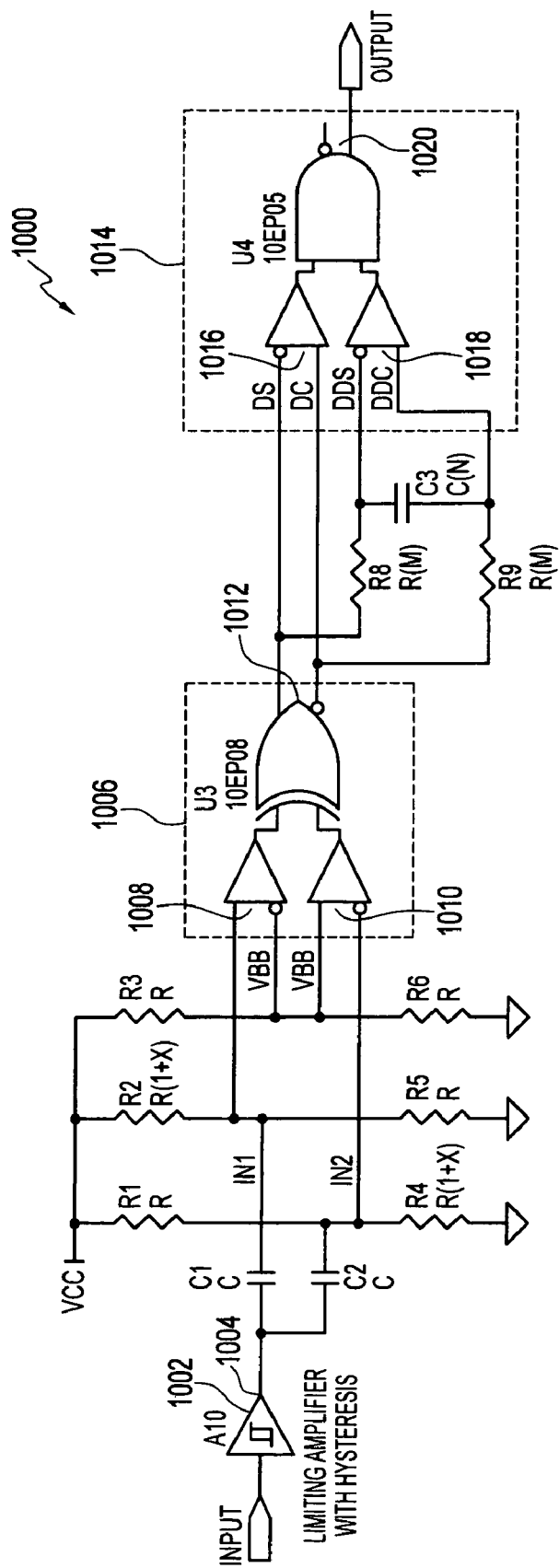
FIG. 12 shows, in electrical schematic diagram form, a portion of a signal detector device according to one embodiment of the invention.

FIG. 12 shows a further PECL based device 1000 according to another embodiment of the invention. Device 1000 has a limiting amplifier device 1002 with a single ended output 1004. Device 1000 also includes a PECL logic gate device 1006 including first and second differential inputs 1008, 1010 and a differential output 1012. Also as shown in FIG. 12, device 1000 includes a deglitch device that employs a PECL AND logic gate device 1014 with differential inputs 1016, 1018 and a differential output 1020. An exemplary device having these characteristics is available from several manufacturers, and is commonly identified as 10EP05.

One of ordinary skill in the art, having understood the present invention, will appreciate that many different embodiments are possible, including many embodiments having, for example, different respective biasing arrangements. In devices 500, 900, 950 and 1000 presented in FIGS. 6, 10, 11 and 12 respectively, the biasing scheme reflects the idea that when no signal is present at the input to the signal presence detector device the output of an XOR gate device is in a first logic state, while the presence of a signal at the input to the signal presence detector device causes the output of the XOR gate device to alter its logic state. As will be discussed in additional detail below, many other devices and biasing arraignment are possible including devices having limiting (hysteretic) amplifiers with single-ended and differential outputs.

Figure 13:
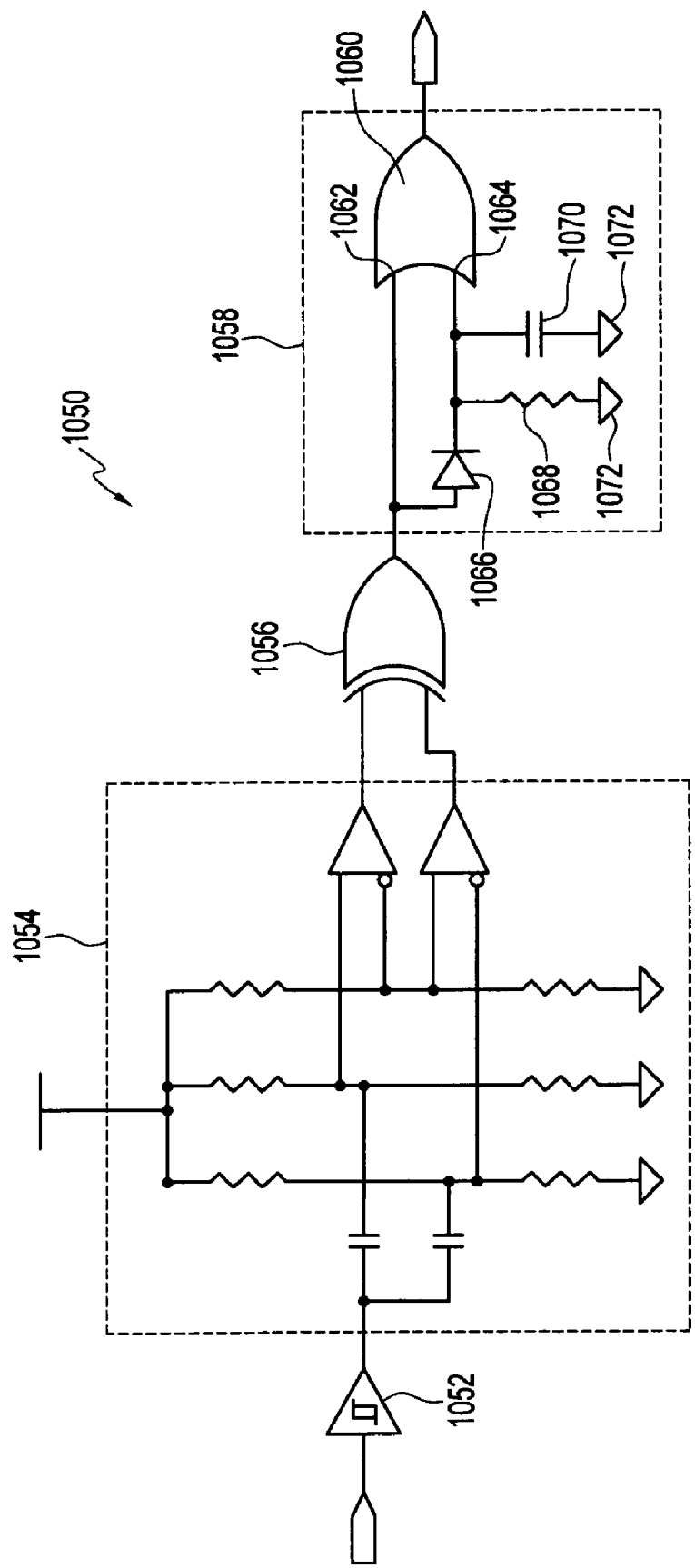
FIG. 13 shows, in electrical schematic diagram form, a portion of a signal detector device according to one embodiment of the invention.
Figure 14:
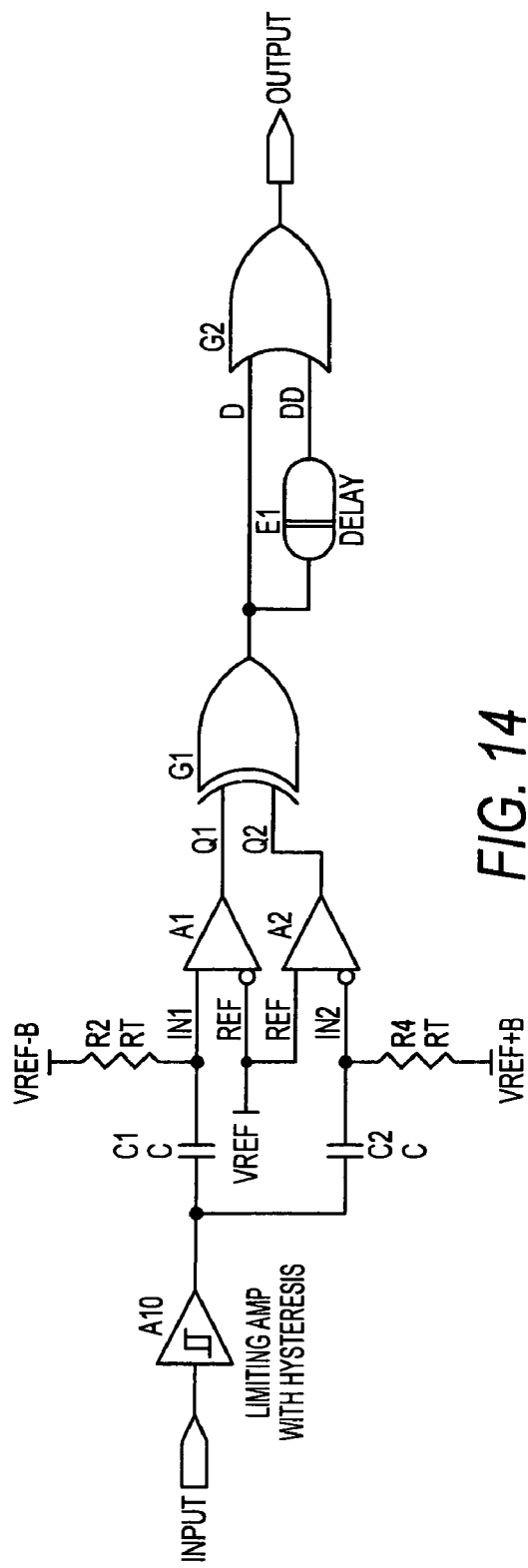
FIG. 14 shows, in electrical schematic diagram form, a portion of a signal detector device including a single ended hysteretic amplifier according to one embodiment of the invention.
Figure 15:
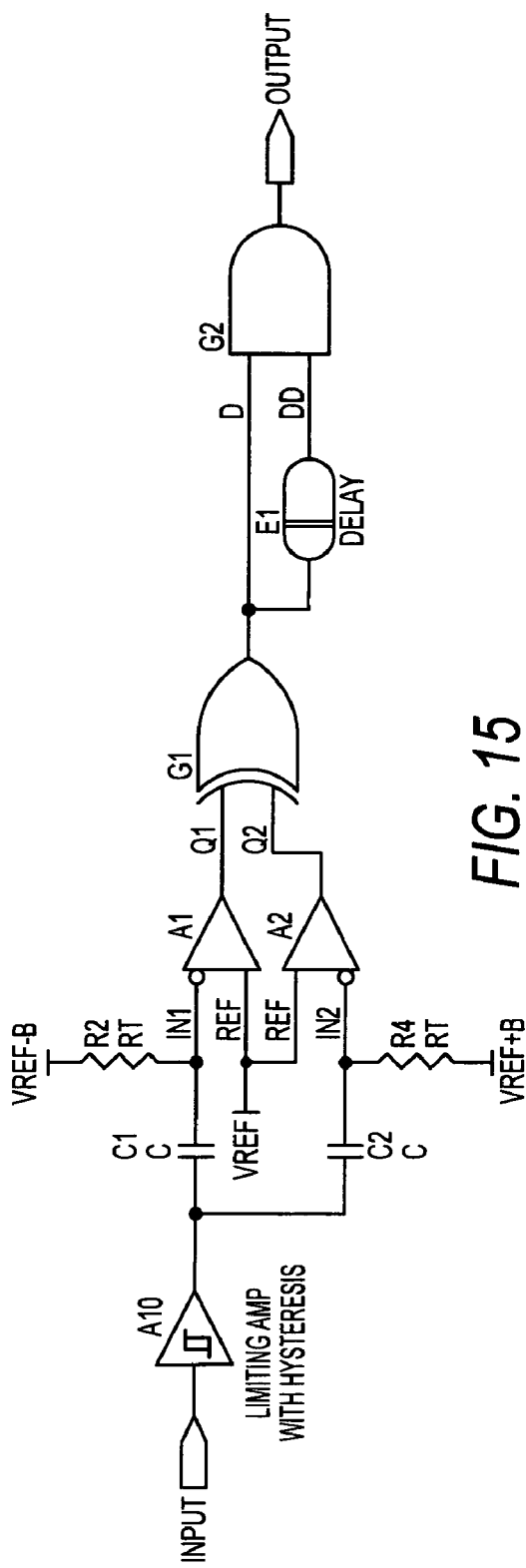
FIG. 15 shows, in electrical schematic diagram form, a portion of a signal detector device including a single ended hysteretic amplifier according to one embodiment of the invention.
Figure 16:
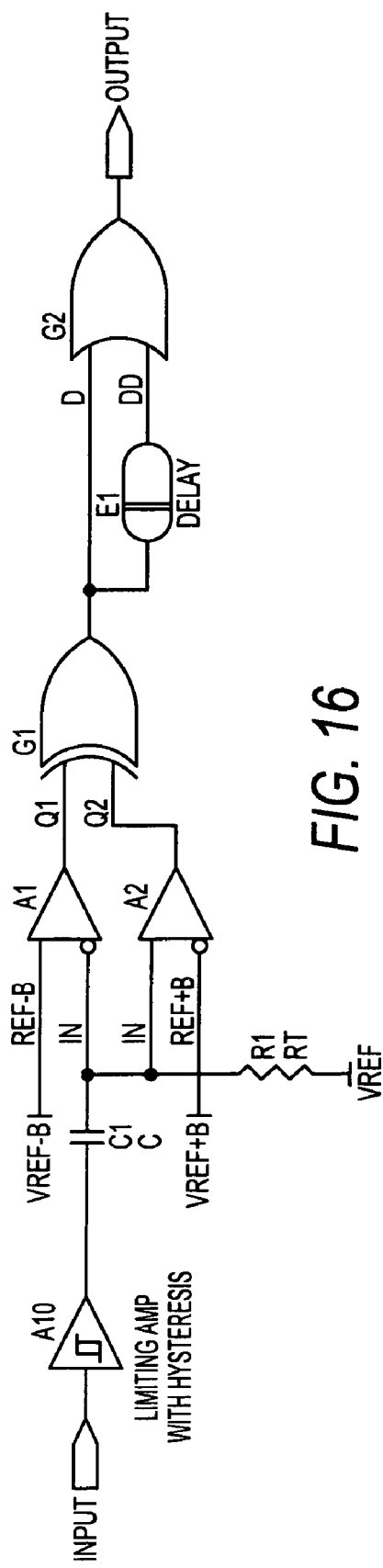
FIG. 16 shows, in electrical schematic diagram form, a portion of a signal detector device including a single ended hysteretic amplifier according to one embodiment of the invention.
Figure 17:
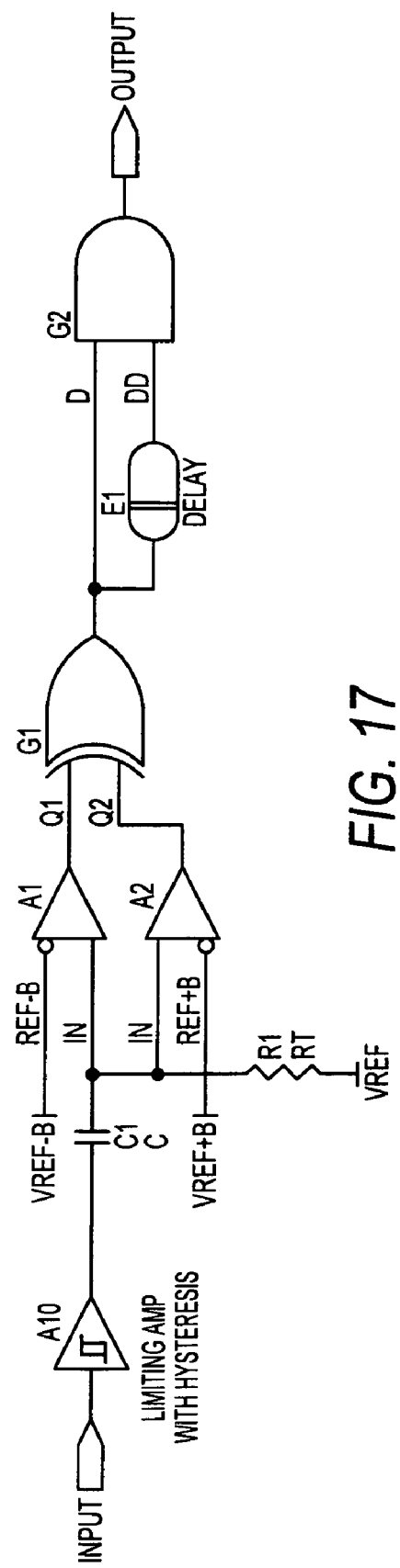
FIG. 17 shows, in electrical schematic diagram form, a portion of a signal detector device including a single ended hysteretic amplifier according to one embodiment of the invention.
Figure 18:
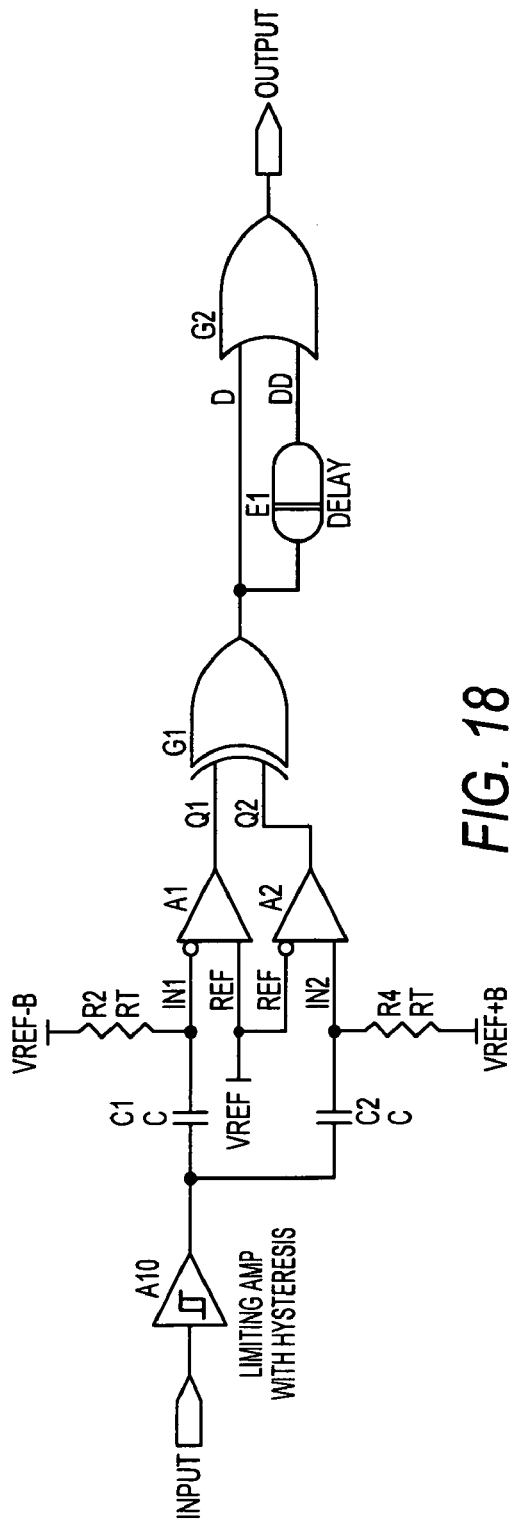
FIG. 18 shows, in electrical schematic diagram form, a portion of a signal detector device including a single ended hysteretic amplifier according to one embodiment of the invention.
Figure 19:
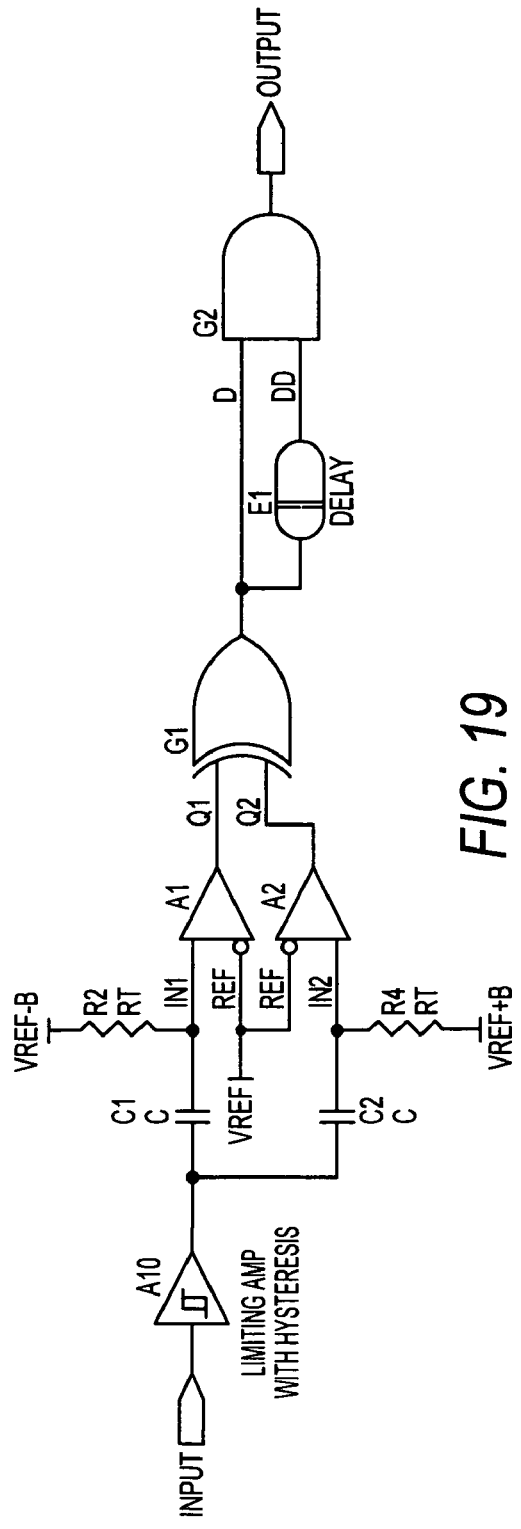
FIG. 19 shows, in electrical schematic diagram form, a portion of a signal detector device including a single ended hysteretic amplifier according to one embodiment of the invention.
Figure 20:
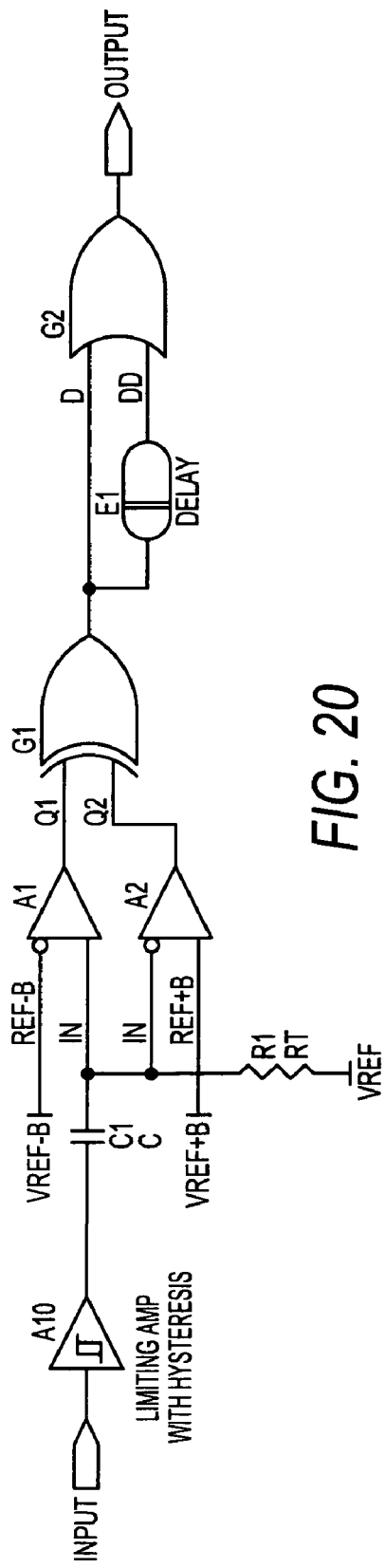
FIG. 20 shows, in electrical schematic diagram form, a portion of a signal detector device including a single ended hysteretic amplifier according to one embodiment of the invention.
Figure 21:
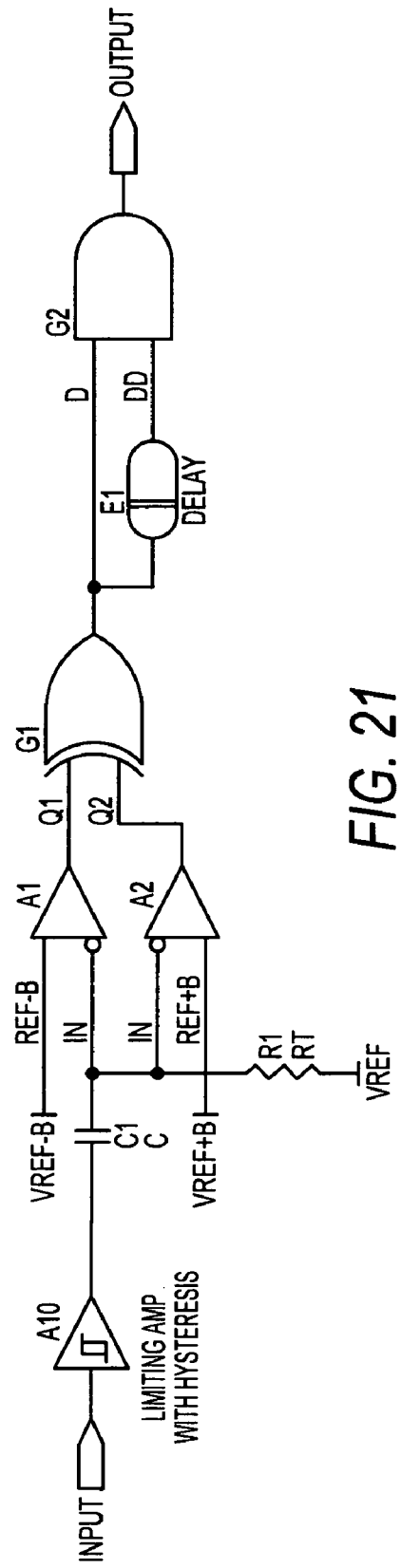
FIG. 21 shows, in electrical schematic diagram form, a portion of a signal detector device including a single ended hysteretic amplifier according to one embodiment of the invention.
Figure 22:
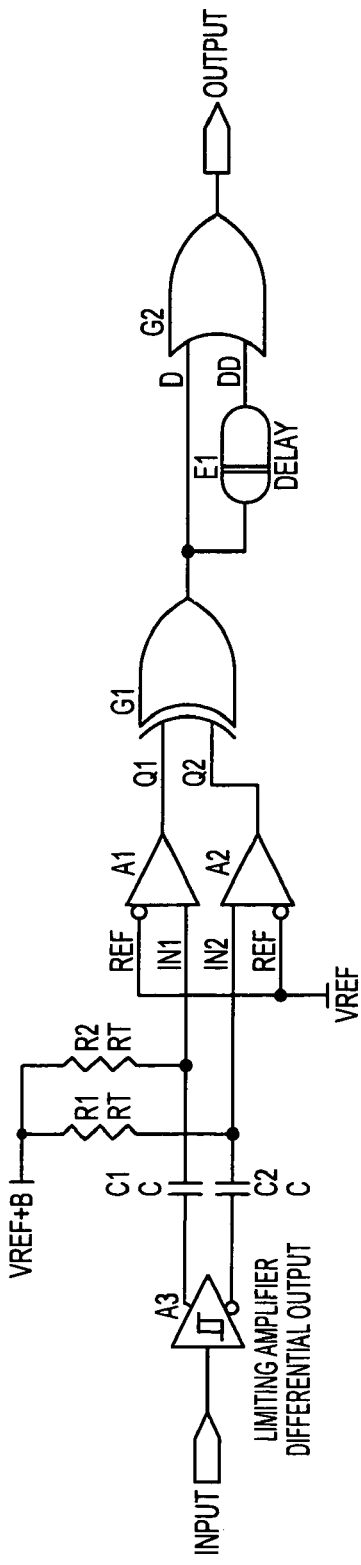
FIG. 22 shows, in electrical schematic diagram form, a portion of a signal detector device including a double ended hysteretic amplifier according to one embodiment of the invention.
Figure 23:
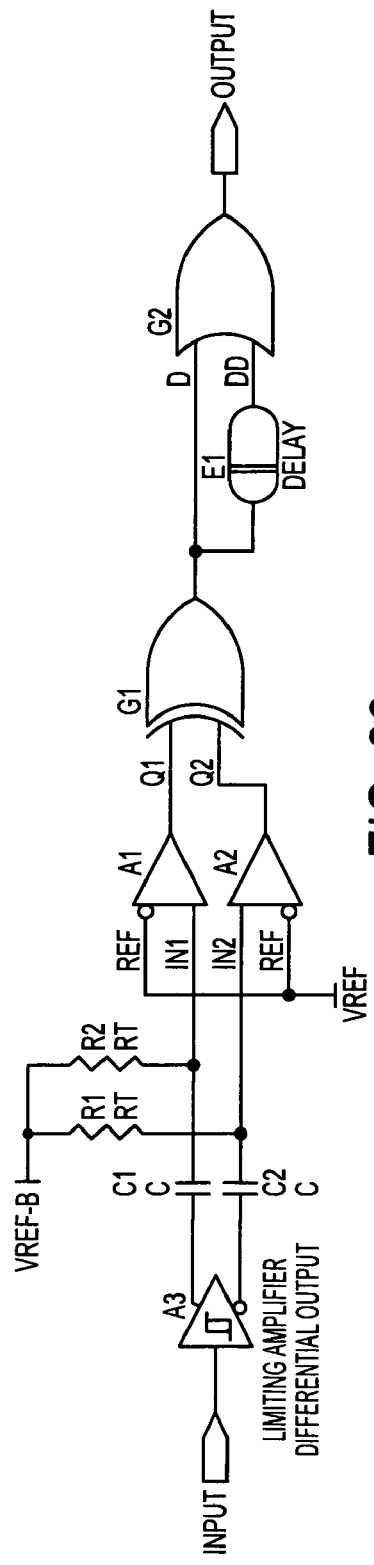
FIG. 23 shows, in electrical schematic diagram form, a portion of a signal detector device including a double ended hysteretic amplifier according to one embodiment of the invention.
Figure 24:
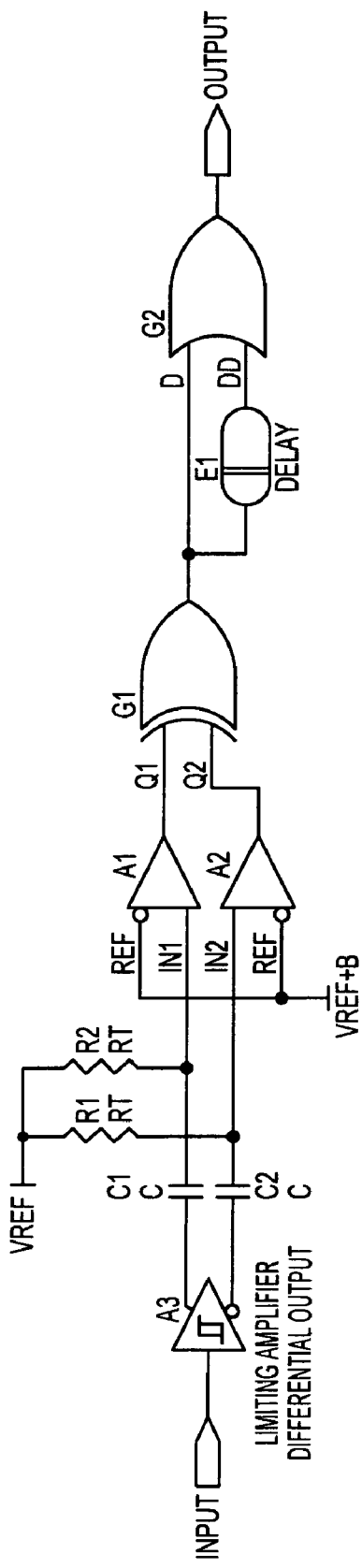
FIG. 24 shows, in electrical schematic diagram form, a portion of a signal detector device including a double ended hysteretic amplifier according to one embodiment of the invention.
Figure 25:
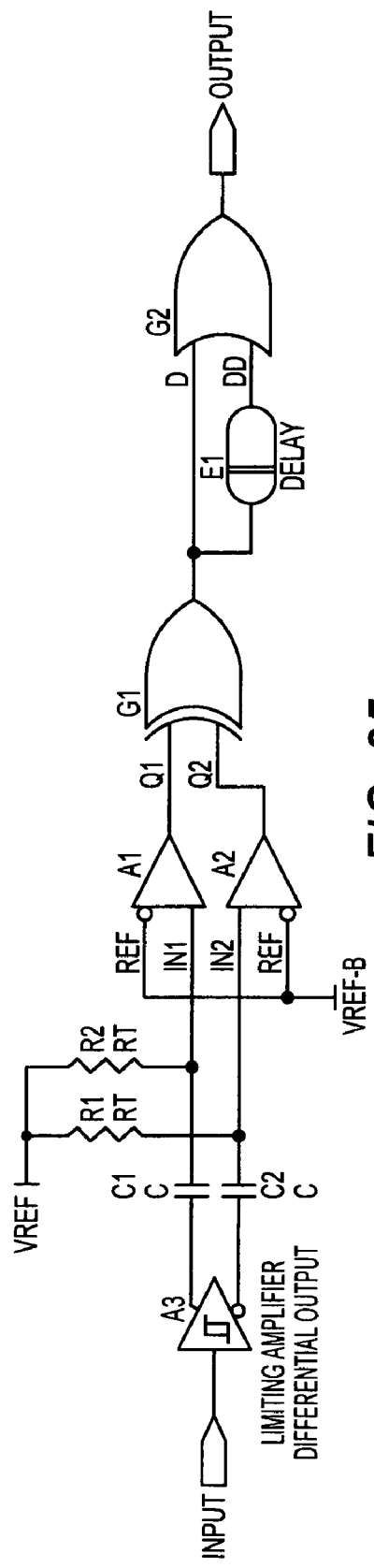
FIG. 25 shows, in electrical schematic diagram form, a portion of a signal detector device including a double ended hysteretic amplifier according to one embodiment of the invention.
Figure 28:
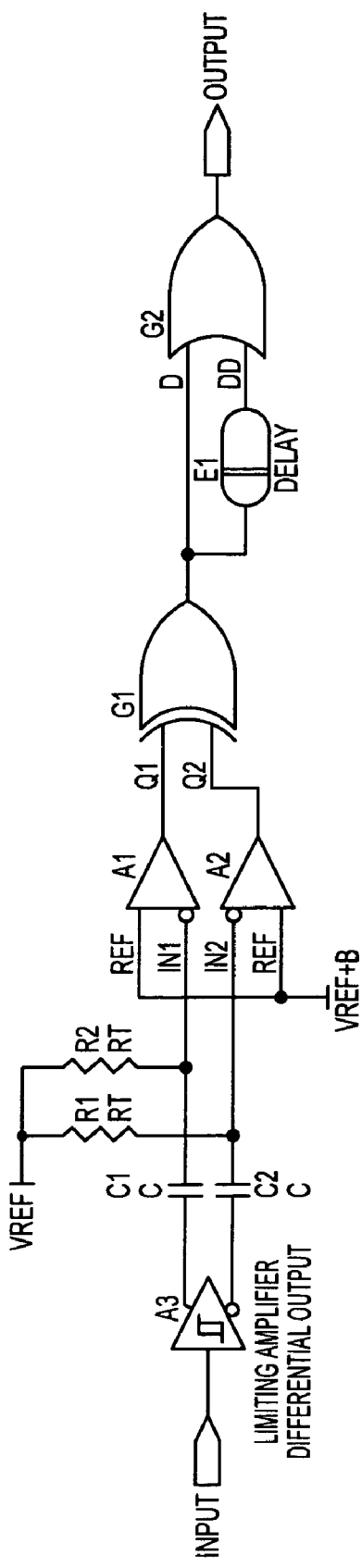
FIG. 28 shows, in electrical schematic diagram form, a portion of a signal detector device including a double ended hysteretic amplifier according to one embodiment of the invention.
Figure 29:
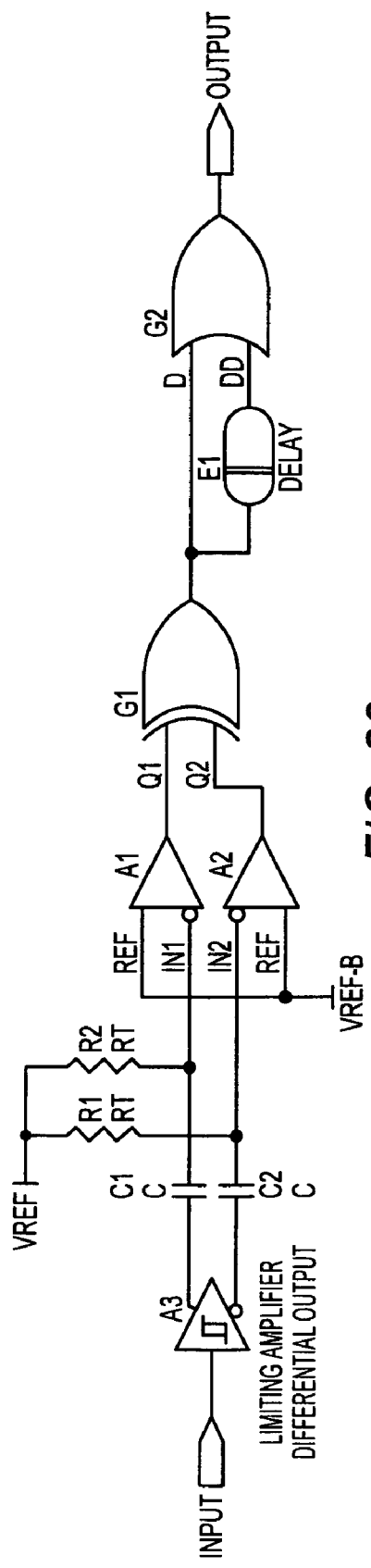
FIG. 29 shows, in electrical schematic diagram form, a portion of a signal detector device including a double ended hysteretic amplifier according to one embodiment of the invention.
Figure 30:
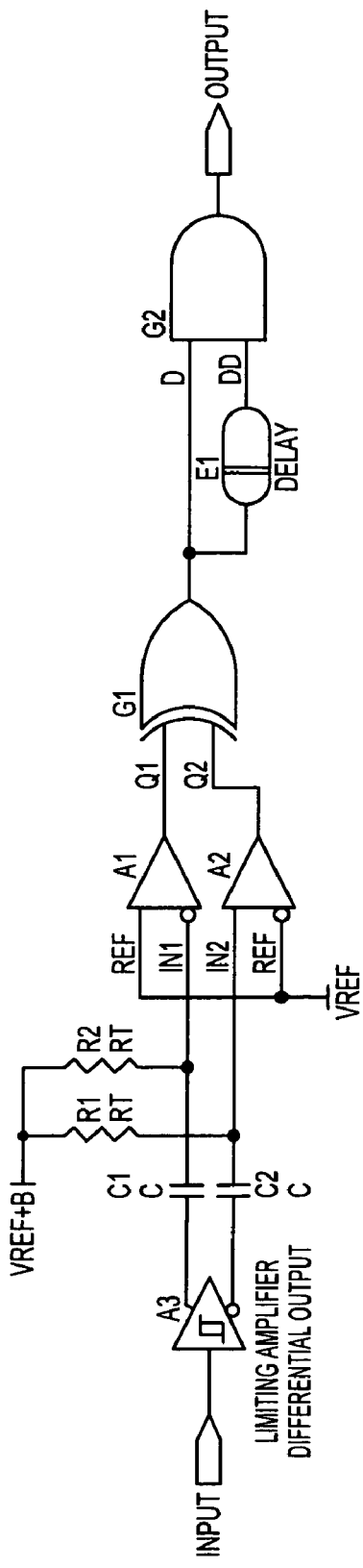
FIG. 30 shows, in electrical schematic diagram form, a portion of a signal detector device including a double ended hysteretic amplifier according to one embodiment of the invention.
Figure 31:
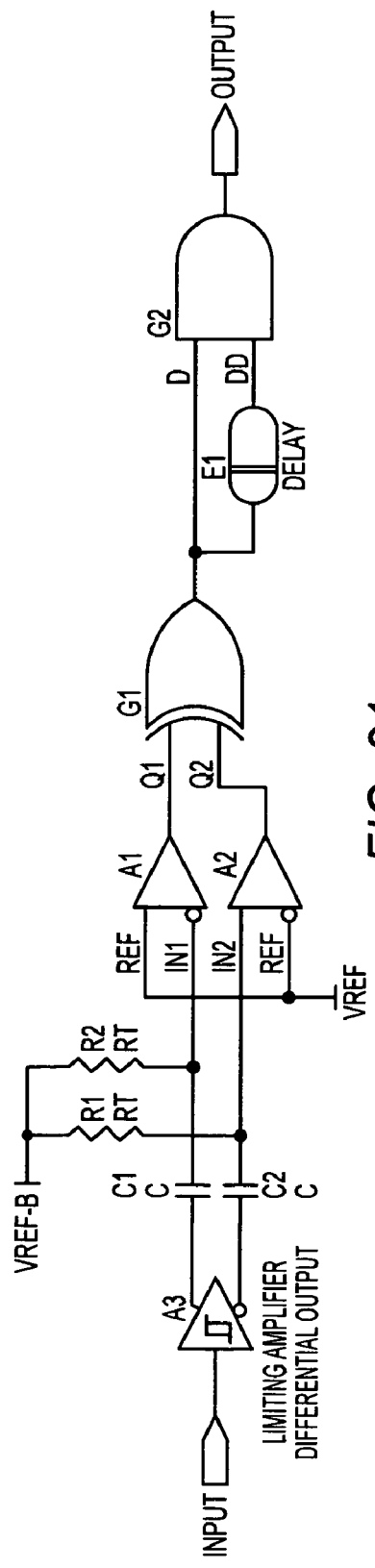
FIG. 31 shows, in electrical schematic diagram form, a portion of a signal detector device including a double ended hysteretic amplifier according to one embodiment of the invention.
Figure 32:
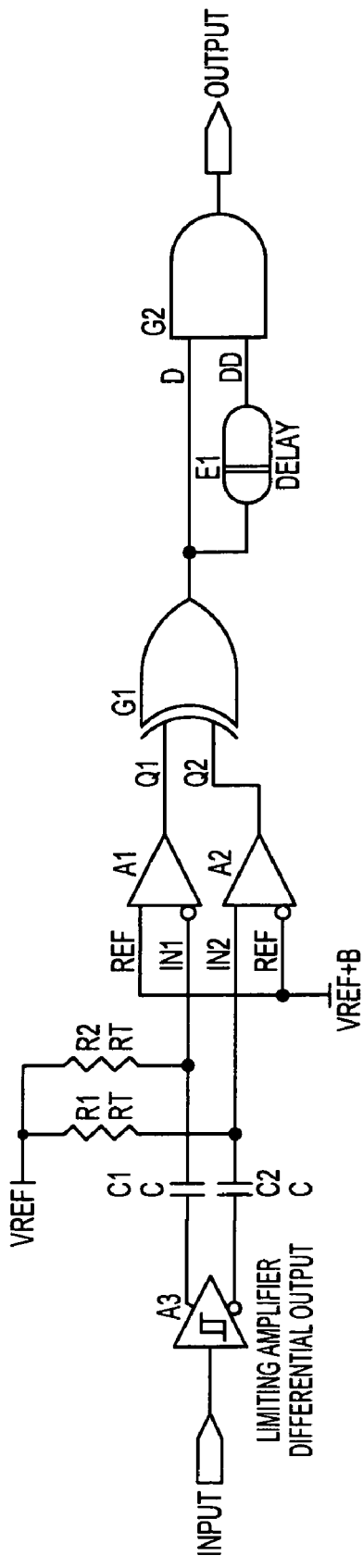
FIG. 32 shows, in electrical schematic diagram form, a portion of a signal detector device including a double ended hysteretic amplifier according to one embodiment of the invention.
Figure 33:
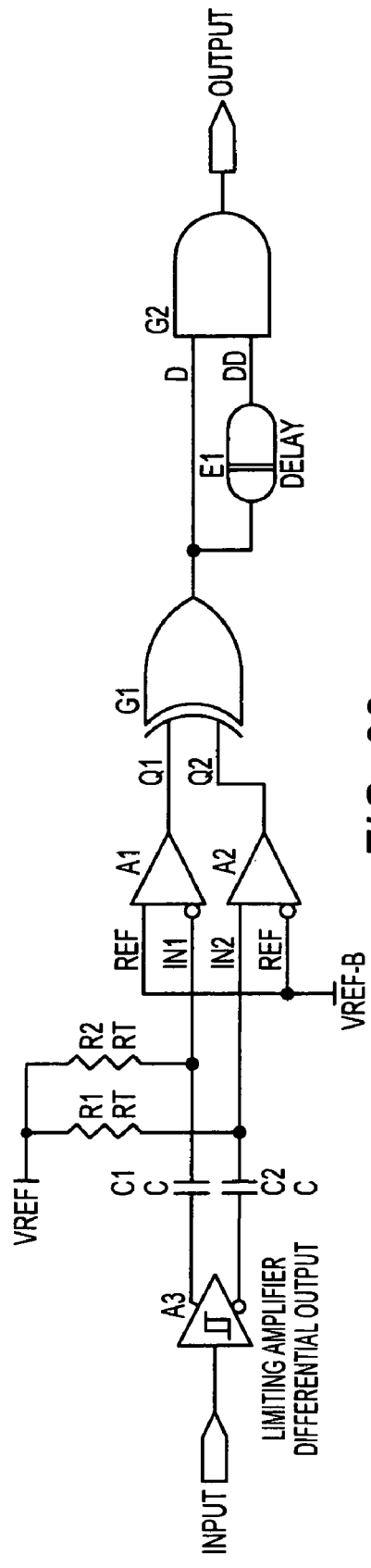
FIG. 33 shows, in electrical schematic diagram form, a portion of a signal detector device including a double ended hysteretic amplifier according to one embodiment of the invention.
Figure 34:
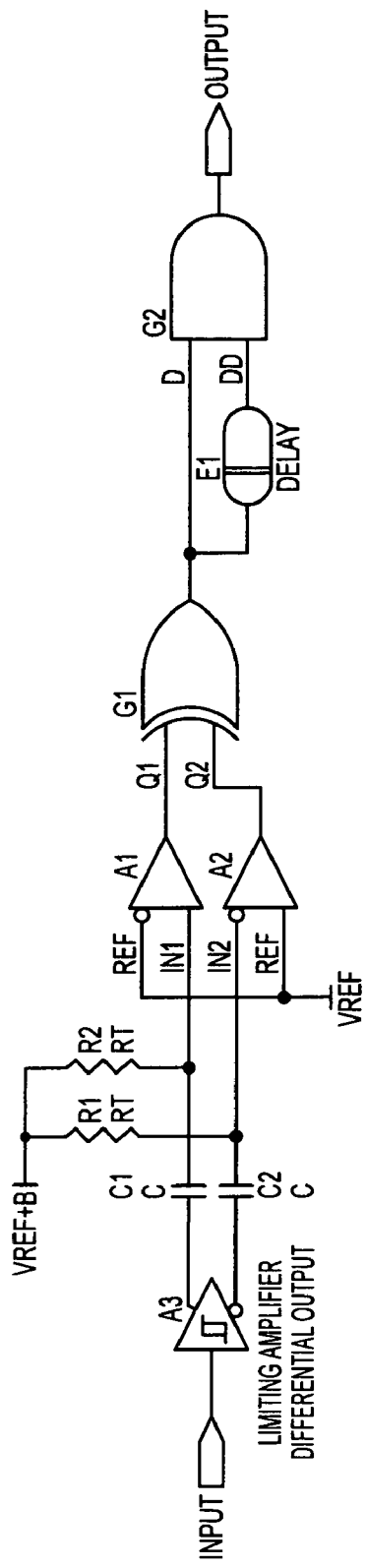
FIG. 34 shows, in electrical schematic diagram form, a portion of a signal detector device including a double ended hysteretic amplifier according to one embodiment of the invention.
Figure 35:
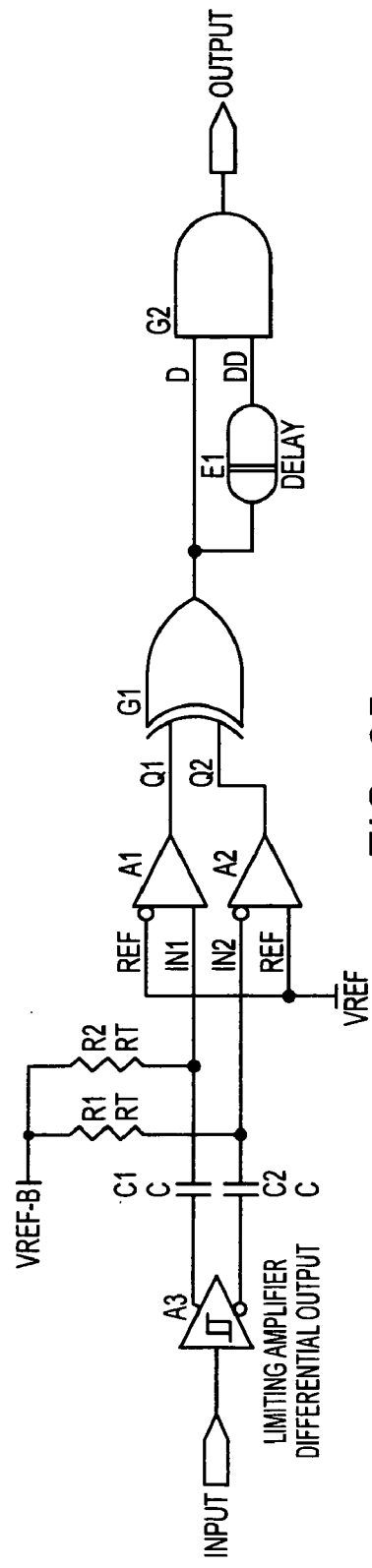
FIG. 35 shows, in electrical schematic diagram form, a portion of a signal detector device including a double ended hysteretic amplifier according to one embodiment of the invention.
Figure 36:
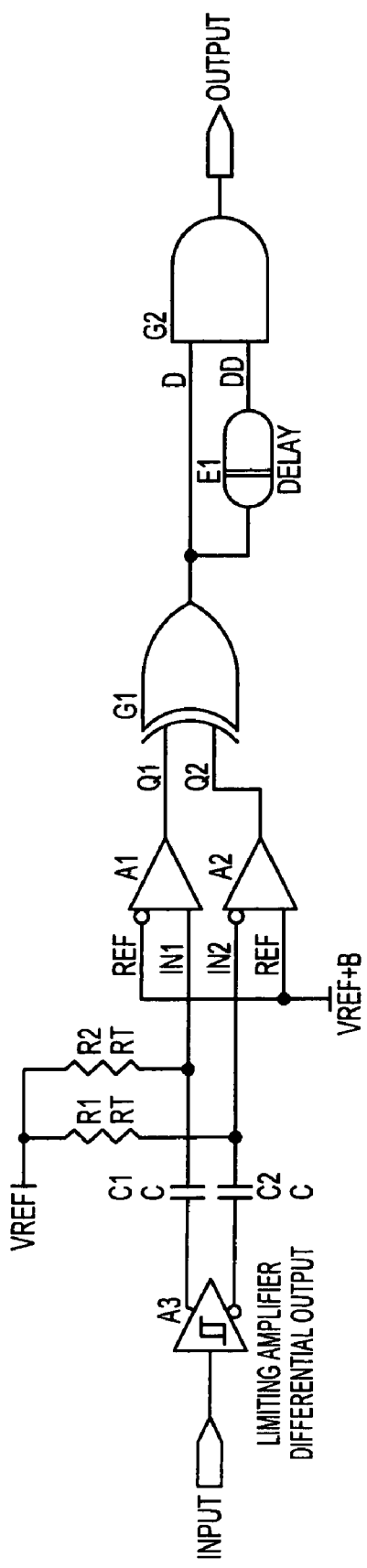
FIG. 36 shows, in electrical schematic diagram form, a portion of a signal detector device including a double ended hysteretic amplifier according to one embodiment of the invention.
Figure 37:
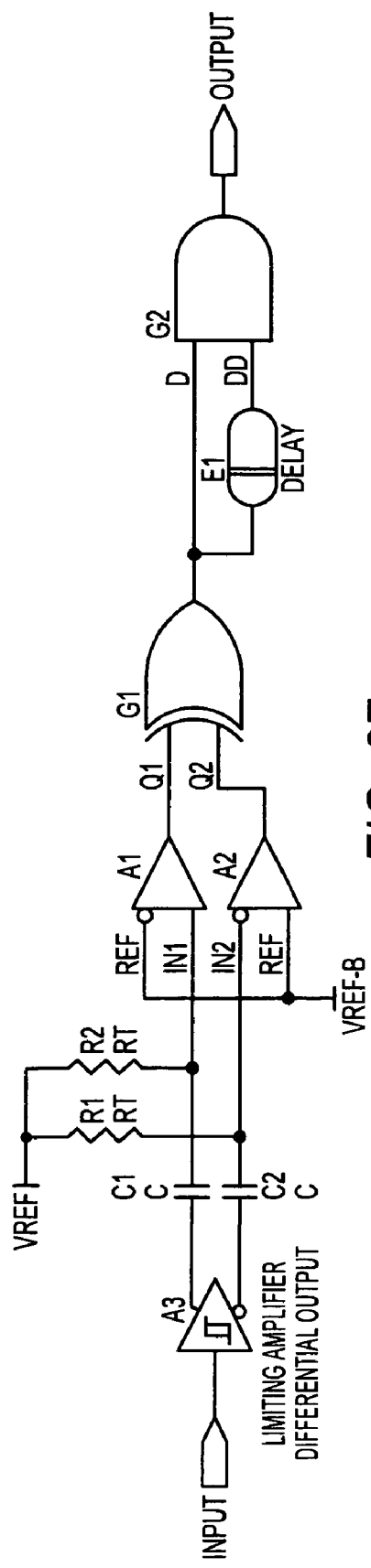
FIG. 37 shows, in electrical schematic diagram form, a portion of a signal detector device including a double ended hysteretic amplifier according to one embodiment of the invention.

According to various embodiments, when a single-ended limiting amplifier is used, as shown, for example, in FIG. 13 three reference voltages are used. In contrast, in an exemplary device that employs a differential output limiting amplifier only two reference voltages are required. In one embodiment, a first reference voltage is selected to be at a center of a dynamic range of first and second comparator devices, while other reference voltages are offset from the first reference voltage by a voltage magnitude B given by the formula:

$$B \le \frac{Vpp}{4}$$

where Vpp is a peak to peak magnitude of a signal at an output of the limiting amplifier.

FIG. 13 shows, in electrical schematic diagram form, a signal presence detector device 1050. Like signal presence detector 500, detector device 1050 includes a signal conditioner device 1052, a transition detector device 1054, an XOR logic gate device 1056 and a deglitch device 1058. Unlike the deglitch device 1058 of detector device 500, the deglitch device 1058 of signal presence detector device 1050 includes an OR logic gate device 1060 with a first input 1062 coupled directly to an output of the XOR logic gate device 1056 and a second input 1064 mutually coupled to respective first terminals of a diode device 1066, a resistive device 1068; and a capacitive device 1070. A second terminal of the diode device 1066 is coupled to the output of the XOR logic gate device 1056. A second terminal of the resistive device 1068 is coupled to a source of ground potential 1072 and a second terminal of the capacitive device 1070 is also coupled to the source of ground potential 1072.

In contrast with the capacitive device by 43 of deglitch device 518, the capacitive device 1070 charges much faster because there is no resistive device 541 in series between the output of the XOR device 1056 and the capacitive device 1070. As would be understood by one of ordinary skill in the art, diode 1056 prevents a rapid discharge of capacitive device 1070 if the output of XOR device 1056 experiences a downward glitch. By proper selection of a resistance of resistive device 1068, an appropriate RC time constant of deglitch device 1058 can be selected so as to insure adequate deglitching of output signals. In addition, proper selection of resistive device 1068 and capacitive device 1070 can allow the use of relatively small RC time constants within the transition detector device 1054.

It should be noted that while many of the embodiments described above include a deglitch device, such a device is not employed in some embodiments of the invention. In such embodiments, the characteristics of the transition detector device and/or the glitch tolerance of a device receiving the signal presence detection signal output by the XOR gate allow the output of the XOR gate to be used directly as a signal presence detection signal.

FIGS. 14-21 show, in electrical schematic diagram form, various embodiments of the invention including respective single-ended limiting hysteretic amplifiers. FIGS. 22-37 show, in electrical schematic diagram form, various embodiments of the invention including respective double-ended hysteretic amplifiers. As would be understood by one of ordinary skill in the art, each of these embodiments offers its respective advantages and is to be employed according to the requirements of a particular application. It is noted that these embodiments are merely exemplary of many other embodiments that incorporate the invention and its principles.

While the exemplary embodiments described above have been chosen primarily from the field of burst mode communication, one of skill in the art will appreciate that the principles of the invention are equally well applied, and that the benefits of the present invention are equally well realized, in a wide variety of other systems including, for example, electronic medical systems. Further, while the invention has been described in detail in connection with the presently preferred embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the invention. Accordingly, the invention is not to be seen as limited by the foregoing description, but is only limited by the scope of the appended claims.

The invention claimed is:

1. A signal presence detection device comprising:
   a first reference voltage generation device;
   a second reference voltage generation device;
   a third reference voltage generation device;
   a signal conditioning device having a first output, said first output being mutually coupled to said first and second reference voltage generation devices;
   a comparison device, said comparison device being operatively coupled to said first reference voltage generation device, said second reference voltage generation device and said third reference voltage generation device, said comparison device being adapted to compare a voltage of said first reference voltage generation device to a voltage of said third reference voltage device and said comparison device being adapted to compare a voltage of said second reference voltage generation device to said voltage of said third reference voltage device to produce respective first and second comparison state signals; and
   an XOR logic gate device, said XOR logic gate device being adapted to receive said first and second comparison state signals at respective first and second inputs thereof and produce a signal presence detection output.

2. A signal presence detection device as defined in claim 1 wherein said first reference voltage generation device comprises a first voltage divider.

3. A signal presence detection device as defined in claim 1 wherein said first and second reference voltage generation devices are mutually coupled to a first reference voltage and said third reference voltage generation device is coupled to a separate second reference voltage.

4. A signal presence detection device as defined in claim 1 wherein said signal conditioning device comprises a hysteretic device.

5. A signal presence detection device as defined in claim 4 wherein said hysteretic device comprises a Schmitt trigger device.

6. A signal presence detection devices defined in claim 1 wherein said comparison device comprises a voltage comparator.

7. A signal presence detection device comprising:
   a first reference voltage generation device;
   a second reference voltage generation device;
   a third reference voltage generation device;
   a signal conditioning device having a first output, said first output being mutually coupled to said first and second reference voltage generation devices;
   a comparison device, said comparison device being operatively coupled to said first reference voltage generation device, said second reference voltage generation device and said third reference voltage generation device, said comparison device being adapted to compare a voltage of said first reference voltage generation device to a voltage of said third reference voltage device and said comparison device being adapted to compare a voltage of said second reference voltage generation device to said voltage of said third reference voltage device to produce respective first and second comparison state signals; and
   a logic gate device, said logic gate device being adapted to receive said first and second comparison state signals at respective first and second inputs thereof and produce a signal presence detection output.

8. A signal presence detection device as defined in claim 7 wherein said first output comprises a double-ended output.

9. A signal presence detection device as defined in claim 7 wherein said logic gate device comprises an XOR logic gate device.

10. A signal presence detection device as defined in claim 7 further comprising:
    a deglitch device having a deglitch input and a deglitch output, said deglitch input being coupled to an output of said logic gate device and adapted to receive said signal presence detection output from said output of said logic gate device.

11. A signal presence detection device as defined in claim 10 wherein said deglitch device comprises a second logic gate device.

12. A signal presence detection device as defined in claim 11 wherein said deglitch device further comprises a timing device coupled to an input of said second logic gate device.

13. A signal presence detection device as defined in claim 12 wherein said timing device comprises a capacitor and a resistor.

14. A signal presence detection device as defined in claim 10 wherein said deglitch device comprises a delay line and a logic gate coupled to said delay line.

15. A signal presence detection device as defined in claim 7 wherein said first and second comparison state signals are related to a conditioned input data stream.

16. A signal presence detection devices defined in claim 7 wherein said logic gate is adapted to receive a conditioned input data stream, said conditioned input data stream including a data gap and a data burst, said logic gate being adapted to produce a data burst indication within a single bit time of receiving a first transition of said data burst.

17. A signal presence detection device as defined in claim 16 wherein said deglitch device is adapted to cooperate with said logic gate device to sustain a data burst indication substantially uninterrupted for a duration of said data burst.

18. A signal presence detection device as defined in claim 10 wherein said logic device comprises an output, said output being signalingly coupled to a servo device.

19. A signal presence detection device as defined in claim 10 wherein said logic device comprises an output, said output being signalingly coupled to a vehicle fly-by-wire device.

20. A signal presence detection devices defined in claim 10 wherein said vehicle fly-by-wire device comprises an aircraft fly-by-wire device.

* * * * *